(12) United States Patent
Tseng et al.

(10) Patent No.: US 9,552,882 B2
(45) Date of Patent: Jan. 24, 2017

(54) SENSE AMPLIFIER WITH EFFICIENT USE OF DATA LATCHES

(71) Applicant: SanDisk Technologies Inc., Plano, TX (US)

(72) Inventors: Tai-Yuan Tseng, Milpitas, CA (US); Yenlung Li, San Jose, CA (US); Cynthia Hsu, Milpitas, CA (US); Kwang Ho Kim, Pleasanton, CA (US); Man L Mui, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/616,289

(22) Filed: Feb. 6, 2015

(65) Prior Publication Data

US 2015/0221348 A1 Aug. 6, 2015

Related U.S. Application Data

(60) Provisional application No. 61/936,867, filed on Feb. 6, 2014, provisional application No. 61/936,870, filed on Feb. 6, 2014.

(51) Int. Cl.
*G06F 12/00* (2006.01)
*G11C 16/10* (2006.01)
(Continued)

(52) U.S. Cl.
CPC ........... *G11C 16/10* (2013.01); *G11C 11/5628* (2013.01); *G11C 16/3459* (2013.01); *G11C 16/24* (2013.01); *G11C 16/26* (2013.01)

(58) Field of Classification Search
CPC ..... G11C 16/10; G11C 16/3459; G11C 16/24; G11C 16/26; G11C 11/5628
See application file for complete search history.

(56) References Cited

U.S. PATENT DOCUMENTS 7,508,715 B2   3/2009   Lee
7,596,031 B2   9/2009   Hemink et al.
(Continued)

OTHER PUBLICATIONS

U.S. Appl. No. 14/195,636, filed Mar. 3, 2014.
(Continued)

*Primary Examiner* — Shawn X Gu
(74) *Attorney, Agent, or Firm* — Vierra Magen Marcus LLP

(57) ABSTRACT

A non-volatile memory includes an data latch structure for programming bit lines using at least three programming levels. A sense amplifier includes a first data latch for controlling the voltage of a corresponding bit line, and a second static data latch with scan circuitry for performing logic operations on the program data and sense results. The sense amplifier scans low verify sense results with program data to generate reduced programming data. The reduced programming data is transferred out of the first data latch after sensing for all states and the program data is scanned to generate program enable/inhibit data which is stored in the first data latch. After setting the bit line to a program inhibit or program enable level, the reduced programming data is transferred back to the first data latch. The bit lines for reduced programming are then adjusted to the reduced programming level.

24 Claims, 17 Drawing Sheets

(51) Int. Cl.
*G11C 16/34* (2006.01)
*G11C 11/56* (2006.01)
G11C 16/26 (2006.01)
G11C 16/24 (2006.01)

(56) References Cited

U.S. PATENT DOCUMENTS

| | | |
|---|---|---|
| 7,616,505 B2 | 11/2009 | Mui et al. |
| 7,733,703 B2 | 6/2010 | Li |
| 8,630,120 B2 | 1/2014 | She et al. |
| 8,705,293 B2 | 4/2014 | She et al. |
| 2010/0135078 A1 | 6/2010 | Iwai et al. |
| 2010/0182841 A1* | 7/2010 | Lee .................. G11C 16/24 365/185.21 |
| 2011/0188317 A1 | 8/2011 | Mui et al. |
| 2014/0003157 A1 | 1/2014 | Mui et al. |

OTHER PUBLICATIONS

U.S. Appl. No. 14/539,150, filed Nov. 12, 2014.
U.S. Appl. No. 14/577,239, filed Dec. 19, 2014.
U.S. Appl. No. 14/525,691, filed Oct. 28, 2014.
U.S. Appl. No. 14/616,309, filed Feb. 6, 2015.
Notice of Allowance dated May 6, 2016, U.S. Appl. No. 14/616,309, filed Feb. 6, 2015.

* cited by examiner

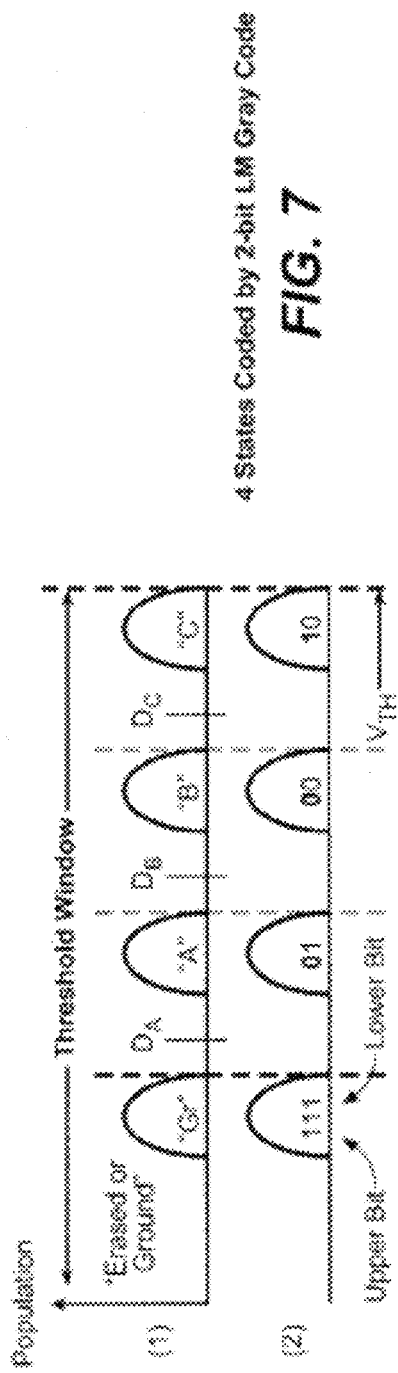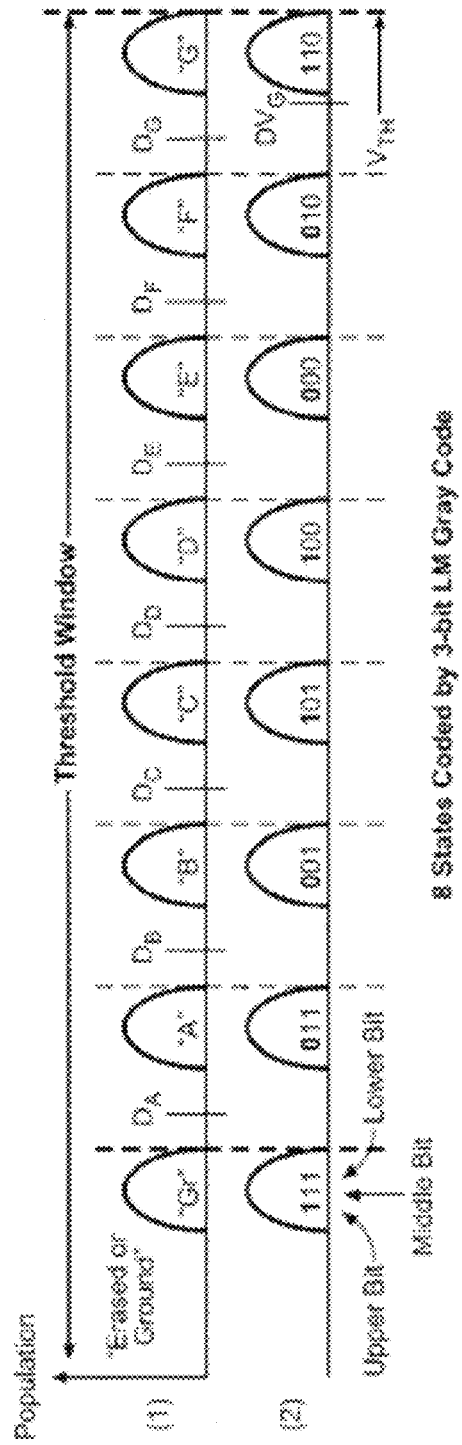
FIG. 7
FIG. 8

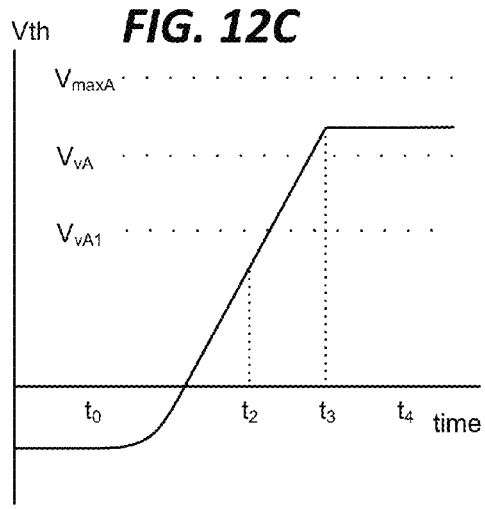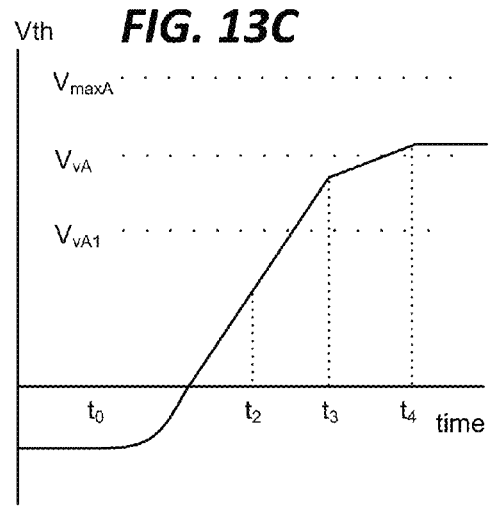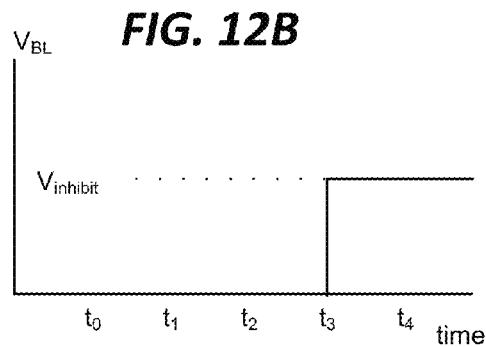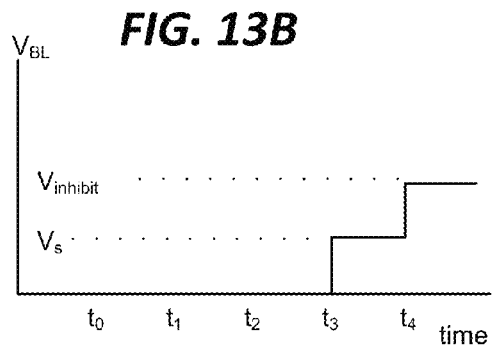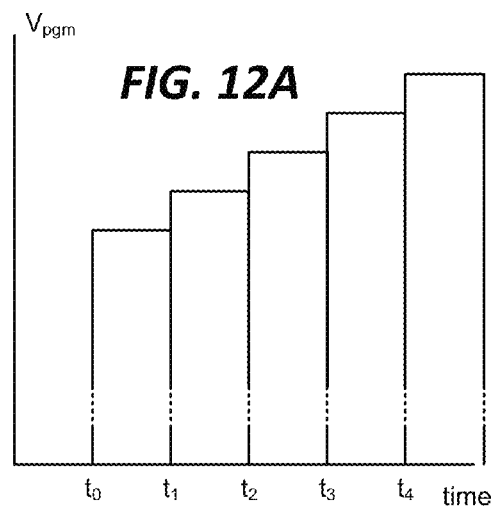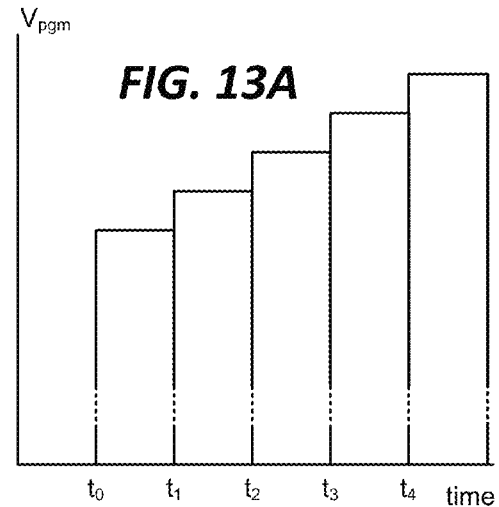

SENSE AMPLIFIER WITH EFFICIENT USE OF DATA LATCHES

CLAIM OF PRIORITY

The present application claims priority from: U.S. Provisional Patent Application No. 61/936,867, entitled "Sense Amplifier with Efficient Use of Data Latches for Lockout," by Tseng et al., filed Feb. 6, 2014; and U.S. Provisional Patent Application No. 61/936,870, entitled "State-Dependent Lockout in Non-Volatile Memory," by Tseng et al., filed Feb. 6, 2014, both of which are incorporated by reference herein in their entirety.

CROSS-REFERENCE TO RELATED APPLICATIONS

The present application is related to U.S. patent application Ser. No. 14/616,309, published as US 2015/0221391 on Aug. 6, 2015 and issued as U.S. Pat. No. 9,437,302 on Sep. 6, 2016, entitled, "State Dependent Lockout in Non-Volatile Memory," by Tseng et al., filed concurrently, cross-referenced and incorporated by reference herein in its entirety.

BACKGROUND OF THE INVENTION

The present disclosure relates to technology for non-volatile storage.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window (also referred to as a "conduction window"). The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In a two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Programming a page of memory cells typically involves a series of alternating program/verify cycles. Each program cycle has the page of memory cells subject to one or more programming voltage pulses. The program cycle is followed by a verify cycle in which each cell is read back to determine if it has been programmed correctly. Those cells that have been verified will be program-inhibited from subsequent programming pulses. The program/verify cycles continue with increasing programming voltage level until all cells in the page have been program-verified.

Both reading and verifying operations are performed by executing one or more sensing cycles in which the conduction current or threshold voltage of each memory cell of the page is determined relative to a demarcation value. In general, if the memory is partitioned into n states, there will be at least n−1 sensing cycles to resolve all possible memory states. In many implementations each sensing cycle may also involve two or more passes. For example, when the memory cells are closely packed, interactions between neighboring charge storage elements become significant and some sensing techniques involve sensing memory cells on neighboring word lines in order to compensate for errors caused by these interactions.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page of contiguous memory cells. All memory elements of a page will be read or programmed together. In currently produced semiconducting integrated circuit memory chips, a memory page may have as many as 64,000 memory cells or memory elements being read or sensed in parallel.

There is an ongoing need for increased performance. Additionally, the massively parallel memory page presents significant issues of noise and interference among the closely packed memory cells and structures that limit sensing accuracy and ultimately performance and storage capacity.

Therefore there is a general need for high capacity and high performance non-volatile memory. In particular, there is a need for sensing circuits of increased speed and less noise.

BRIEF DESCRIPTION OF THE DRAWINGS

FIG. 7 illustrates the threshold voltage distributions of an example 4-state memory array and an example, 2-bit LM coding to represent the four possible memory states.

FIG. 8 illustrates the threshold voltage distributions of an example 8-state memory array, and an example, 3-bit LM coding to represent the eight possible memory states.

FIGS. 12A, 12B and 12C depict one embodiment of a programming process that is performed as part of a coarse/fine programming technique, also referred to as a quick-pass write technique.

FIGS. 13A, 13B and 13C depict one embodiment of a programming process that is performed as part of a coarse/fine programming technique, also referred to as a quick-pass write technique.

DETAILED DESCRIPTION

Figure 1:
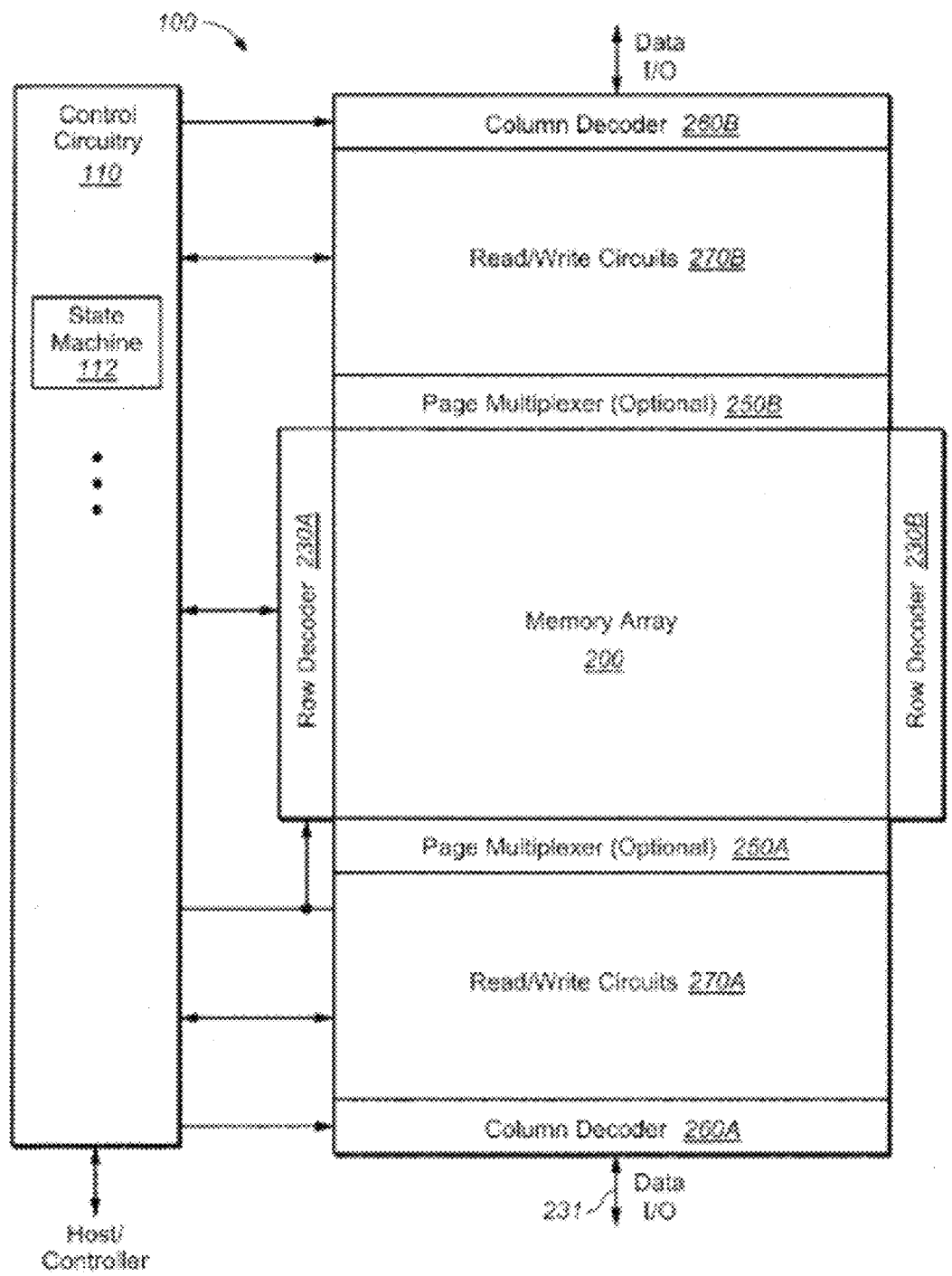
FIG. 1 illustrates schematically the functional blocks of a non-volatile memory chip in which embodiments of the present disclosure may be implemented.

A non-volatile memory having an efficient data latch structure and associated methods of operation are provided. Programming techniques are utilized that include setting at least three bit line voltages for three different groups of memory cells. The bit lines of a first group of memory cells that are to be fully programmed are set to a first voltage, typically ground or 0V. The bit lines of a second group of memory cells that are to be inhibited from programming are set to a second voltage, typically a high voltage such as the memory supply voltage. The bit lines of a third group of memory cells that are to be programmed at a reduced rate are set to a third voltage, typically between the first and second voltages (e.g., 0.5 to 1.0V). The data used to control the bit lines for full programming or reduced programming may be referred to as quick pass write or QPW data. In order to reduce the size of the memory and increase performance, an efficient data latch structure is used to maintain and provide the QPW data for setting the bit line voltage as needed. In one embodiment, a combination of dynamic and static data latches are used to transfer the QPW data to reduce the number of static data latches needed for programming.

A sense amplifier circuit for a corresponding bit line includes a first static data latch for controlling the bit line voltage during various program, read, and verification processes. A second static latch is provided, including a set of latch scan circuits for performing scan operations on data in the sense amplifier using logic operations and combinations of different logic operations. The sense amplifier circuit scans the results of sensing at a plurality of low verify levels for a plurality of states with the program data in a set of user data latches. For example, the sense results at a low verify level may be combined in a logical AND operation with the program data for the bit line. The encoding of a state currently being sensed is applied to the program data before combining with the sense results to generate the QPW result for the target state of the bit line as indicated by the program data. The results of scanning at the low verify levels are stored in the first data latch. After sensing for the lowest state, scan operations for higher level states combine the existing contents of the first data latch with the scan results at those states use a logical OR operation so that when a QPW result is generated for the target state of a bit line, it is not overwritten when sensing at higher non-targeted states for the bit line.

The sense amplifier scans the results of sensing at a plurality of final verify levels for the plurality of states with the output of the set of user data latches. The sense amplifier again applies the encoding of the state currently being sensed to the program data. The results of scanning the results at the final verify levels are stored in the set of user data latches. In this manner, the program data in the set of user data latches is updated to a program inhibit encoding (e.g., the erased state) when the program data matches the state currently being sensed and the sense results are positive.

After sensing at the low and final verify levels for all states, the sense amplifier transfers the contents out of the first data latch which currently stores the QPW data. The contents are moved to a dynamic sense node in one example. The contents can also be moved from the dynamic sense node to the second data latch or directly to the second data latch in various embodiments for longer storage. With the first data latch free, the sense amplifier scans the outputs of the user data latches to generate program enable or inhibit data for the bit line. The sense amplifier sets the bit line voltage to a program inhibit or program enable level based on the first data latch contents. The QPW data is then transferred back to the first data latch from the dynamic sense node or the second data latch. The sense amplifier changes the bit line voltage if the QPW data indicates that reduced programming should be performed, for example, by charging to an intermediate inhibit or programming level.

FIG. 1 illustrates schematically the functional blocks of a non-volatile memory chip in which the present disclosure may be implemented. The memory chip 100 includes a two-dimensional array of memory cells 200, control circuitry 110, and peripheral circuits such as decoders, read/write circuits and multiplexers.

Figure 4:
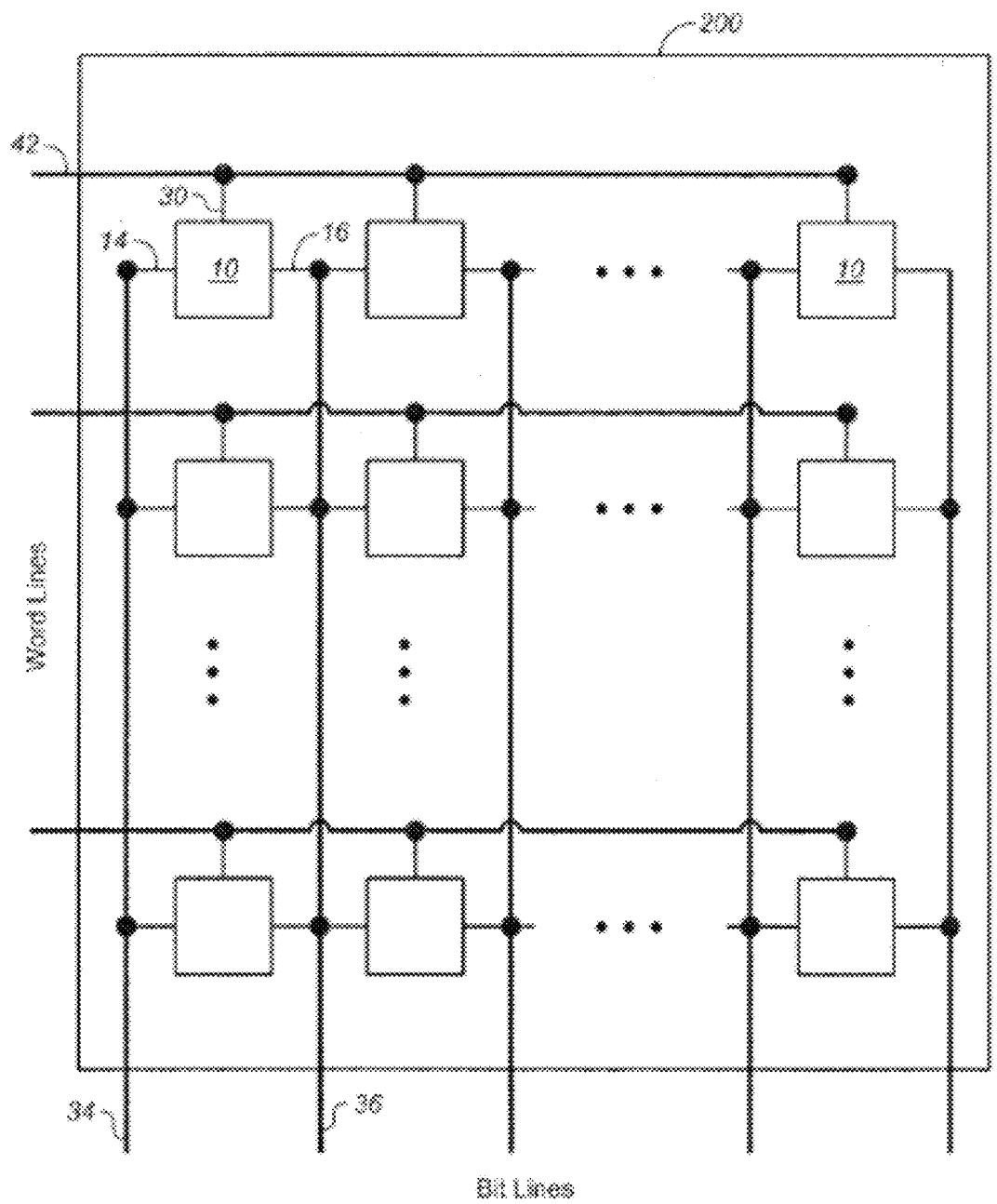
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5). The read/write circuits 270 (split into 270A, 270B) allow a page of memory cells to be read or programmed in parallel. A data I/O bus 231 is coupled to the read/write circuits 270.

In an embodiment, a page is constituted from a contiguous row of memory cells sharing the same word line. In an embodiment, such as where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates an example arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown). The state machine 112 provides chip level control of memory operations. The control circuitry is in communication with a host via an external memory controller.

The memory array 200 is generally organized as a two-dimensional or three-dimensional array of memory cells arranged in rows and columns and addressable by word lines and bit lines. The array can be formed according to an NOR type or an NAND type architecture.

Figure 2:
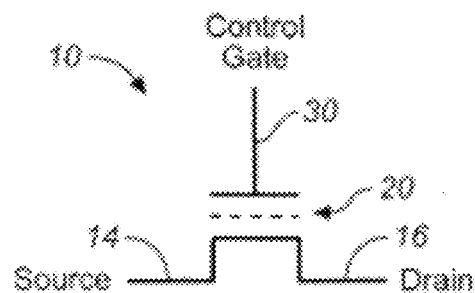
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30. The source and drain are often referred to generically as a source/drain region.

There are many commercially successful non-volatile solid-state memory devices being used today. These memory devices may employ different types of memory cells, each type having one or more charge storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
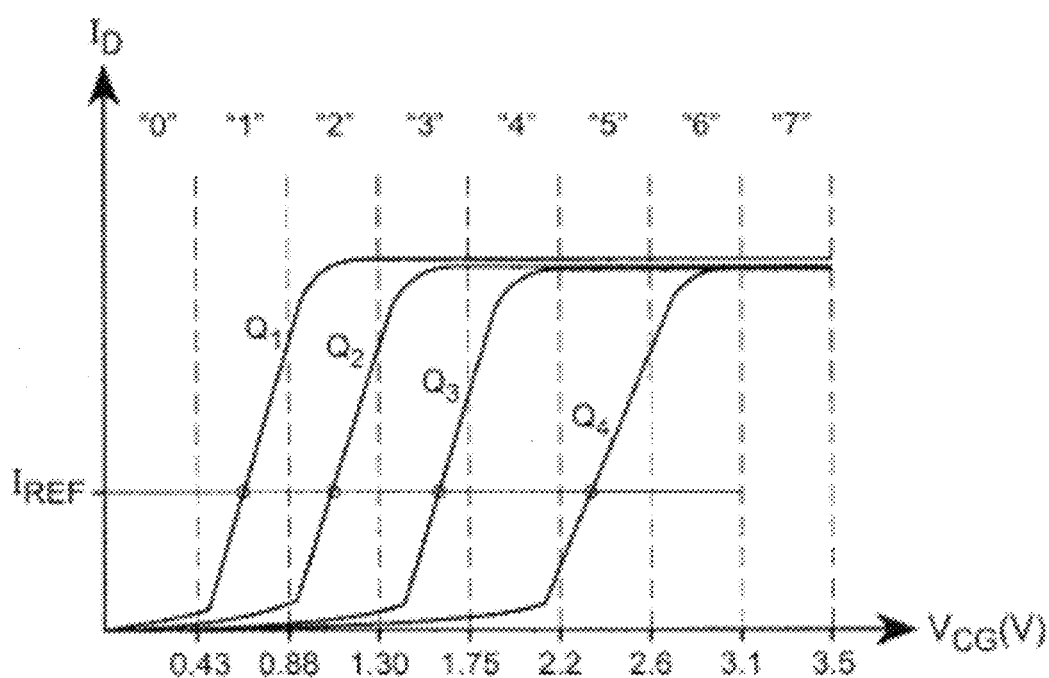
FIG. 3 illustrates the relation between the source-drain current ID and the control gate voltage $V_{CG}$ for four different charges Q1-Q4 that the floating gate may be selectively storing at any one time.

FIG. 3 illustrates the relation between the source-drain current ID and the control gate voltage $V_{CG}$ for four different charges Q1-Q4 that the floating gate may be selectively storing at any one time. The four solid ID versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Eight possible memory states "0", "1", "2", "3", "4", "5", "6" and "7" respectively representing one erased and seven programmed states, may be demarcated by partitioning the threshold window into eight regions in interval of about 0.4V each. For example, if a reference current, IREF of 0.05 uA is used as shown, then the cell programmed with Q1 may be considered to be in a memory state "1" since its curve intersects with $I_{REF}$ in the region of the threshold window demarcated by VCG=0.43V and 0.88V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 350 mV to 450 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
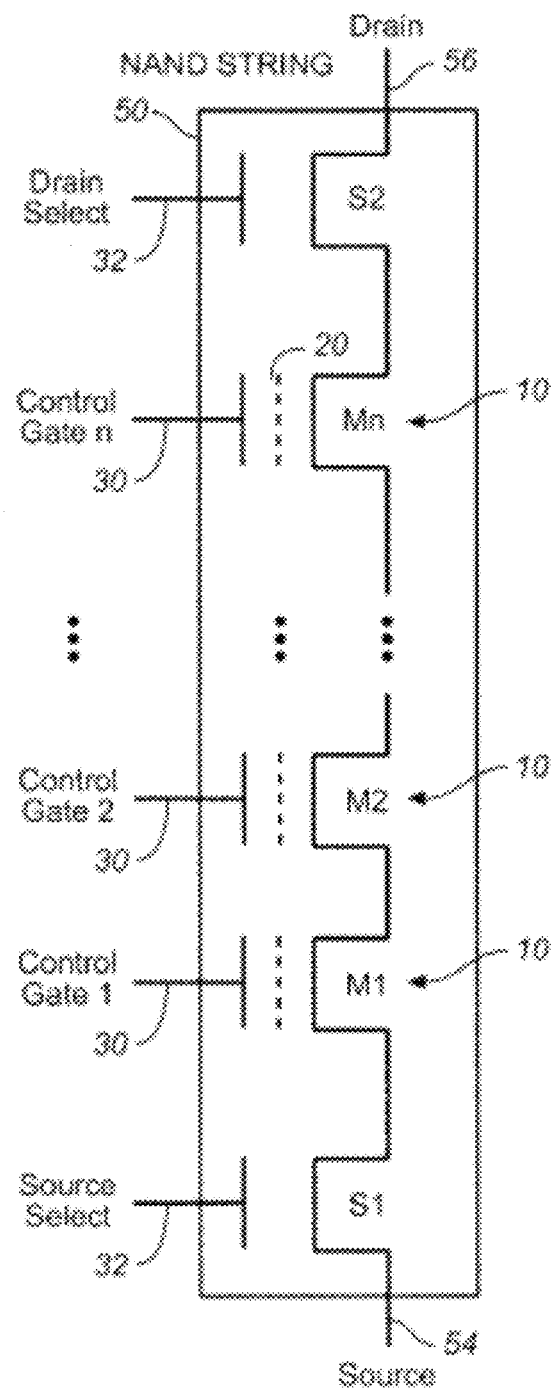
FIG. 5A illustrates schematically a string of memory cells organized into an NAND string.

FIG. 5A illustrates schematically a string of memory cells organized into an NAND string. A NAND string 50 includes a series of memory transistors M1, M2, . . . Mn (e.g., n=4, 8, 16 or higher) daisy-chained by their sources and drains. A pair of select transistors S1, S2 controls the memory transistor chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND strings are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND strings are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
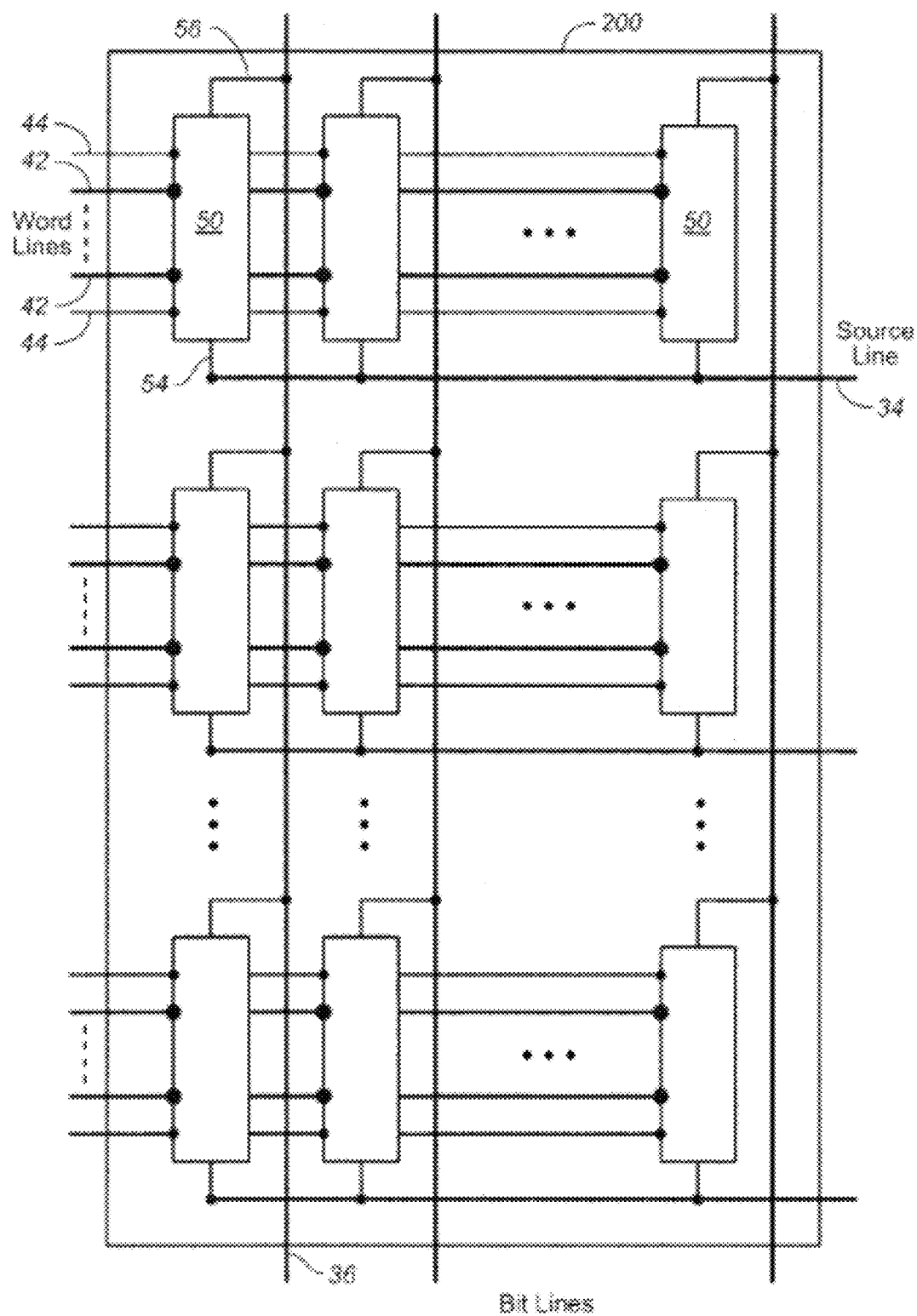
FIG. 5B illustrates an example of an NAND array of memory cells, including NAND strings such as that shown in FIG. 5A.
Figure 6:
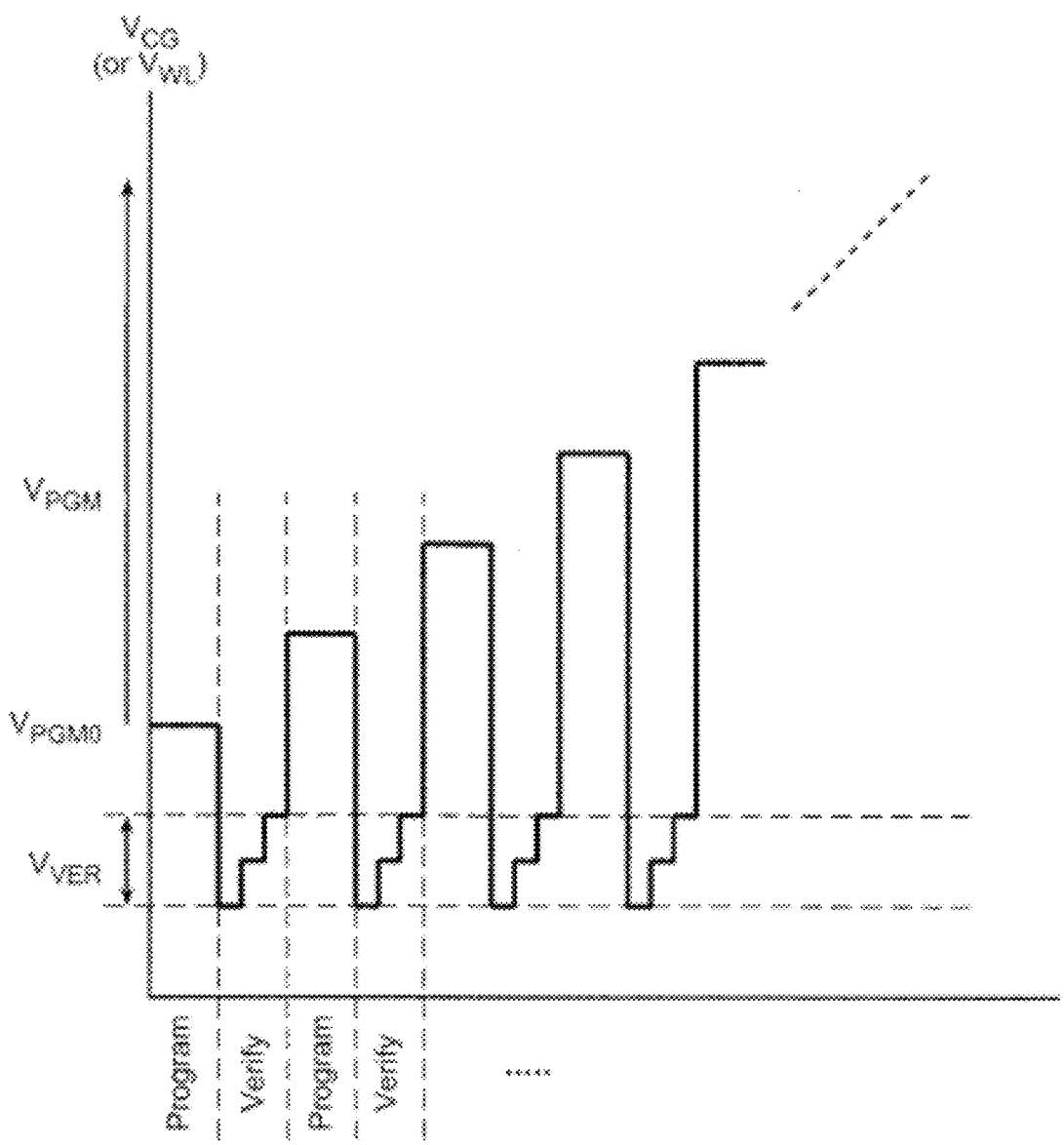
FIG. 6 illustrates a typical technique for programming a page of memory cells to a target memory state by a series of alternating program/verify cycles.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read. FIG. 6 illustrates a typical technique for programming a page of memory cells to a target memory state by a series of alternating program/verify cycles. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$. The cell under programming is subject to this series of programming voltage pulses, with an attempt each time to add incremental charges to the floating gate. In between programming pulses, the cell is read back or verified to determine its source-drain current relative to a breakpoint level. The read back process may involve one or more sensing operations. Programming stops for the cell when it has been verified to reach the target state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are coupled to the word line can be programmed together. Whenever a memory cell of the page has been programmed to its target state, it is program-inhibited while the other cells continue to be subject to programming until all cells of the page have been program-verified.

FIG. 7(1) illustrates the threshold voltage distributions of an example 4-state memory array with an erased state as a ground state "Gr" and progressively more programmed memory states "A", "B" and "C". During read, the four states are demarcated by three demarcation breakpoints, $D_A$-$D_C$.

FIG. 7(2) illustrates an example, 2-bit LM coding to represent the four possible memory states shown in FIG. 7(1). Each of the memory states (viz., "Gr", "A", "B" and "C") is represented by a pair of "upper, lower" code bits, namely "11", "01", "00" and "10" respectively. The "LM"

code has been disclosed in U.S. Pat. No. 6,657,891 and is advantageous in reducing the field-effect coupling between adjacent floating gates by avoiding program operations that require a large change in charges. The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIG. 8(1) illustrates the threshold voltage distributions of an example 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 8(2) illustrates an example, 3-bit LM coding to represent the eight possible memory states shown in FIG. 8(1). Each of the eight memory states is represented by a triplet of "upper, middle, lower" bits, namely "111", "011", "001", "101", "100", "000", "010" and "110" respectively. The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddle between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

Figure 9:
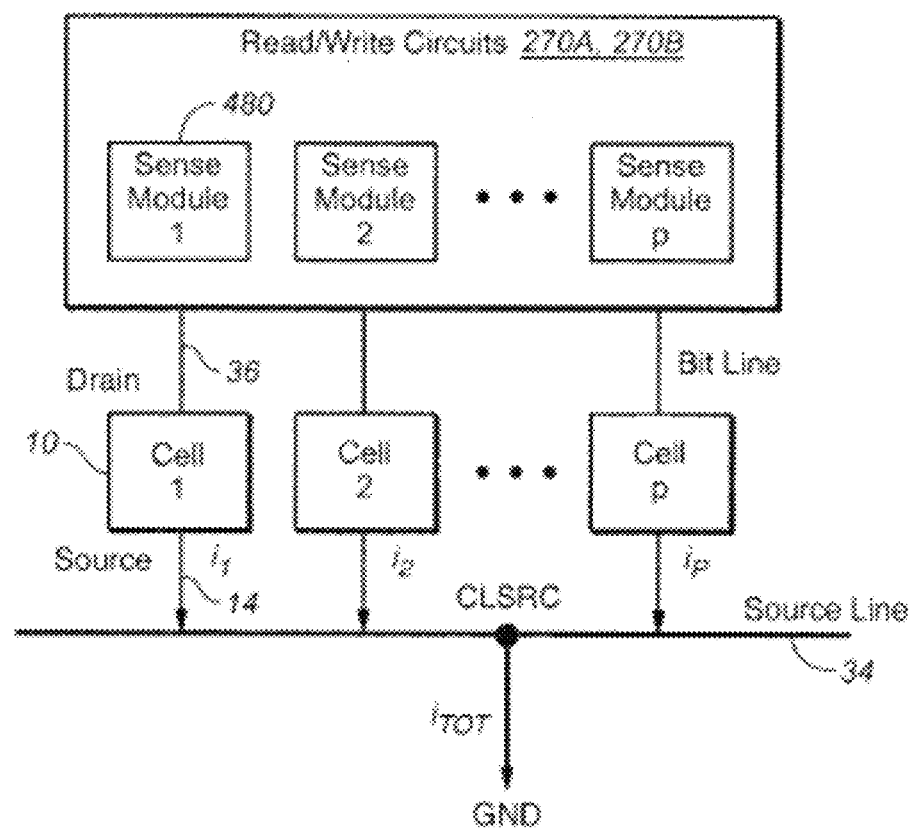
FIG. 9 illustrates the Read/Write Circuits, shown in FIG. 1, containing a bank of sense modules across an array of memory cells.

FIG. 9 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{ToT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbitx4 chip p>150000. In one embodiment, the block is a run of the entire row of cells. This is the so-called "all bit-line" architecture in which the page is constituted from a row of contiguous memory cells coupled respectively to contiguous bit lines. In an embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 10:
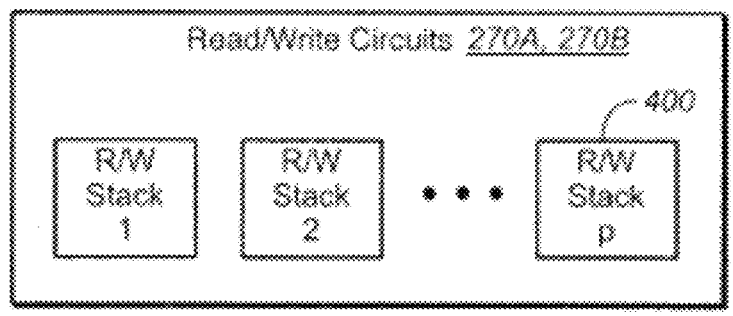
FIG. 10 illustrates schematically an example organization of the sense modules shown in FIG. 9.

FIG. 10 illustrates schematically an example organization of the sense modules shown in FIG. 9. The read/write circuits 270A and 270B containing p sense modules are grouped into a bank of read/write stacks 400.

Figure 11:
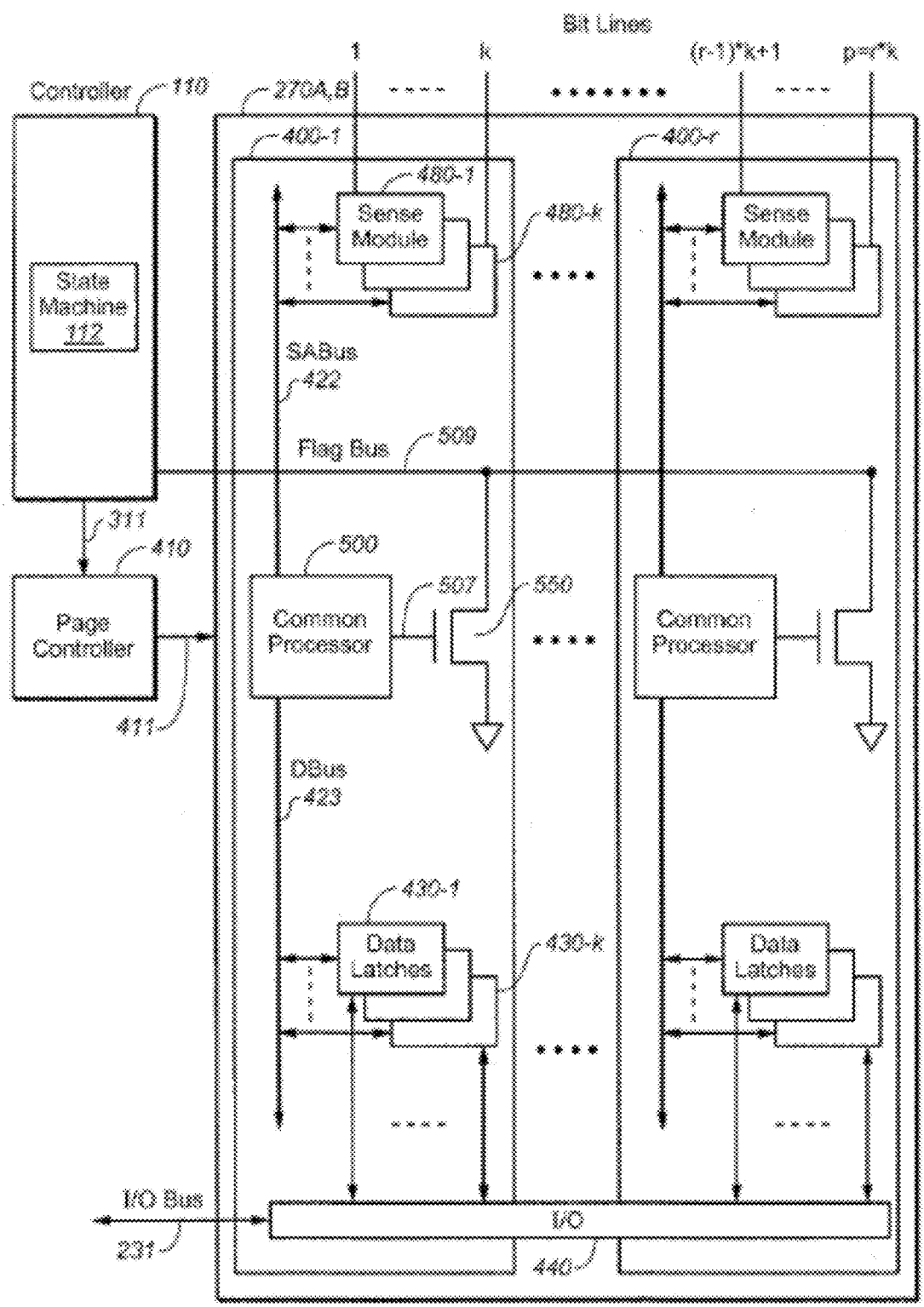
FIG. 11 illustrates in more detail the read/write stacks shown in FIG. 10.

FIG. 11 illustrates in more detail the read/write stacks shown in FIG. 10. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. patent application Publication Number: US20060140007A1 on Jun. 29, 2006.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the example arrangement, the stack bus is partitioned into a SABus 422 for communication between the common processor 500 and the stack of sense modules 480, and a DBus 423 for communication between the processor and the stack of data latches 430. Other bus arrangements are possible. For example a common bus may be used for direct communication between the sense modules 480 and stack of data latches 430.

The stack of data latches 430 include data latches 430-1 to 430-k, one for each memory cell associated with the stack.

The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably pre-charged by the controller 310 and will be pulled down when a status signal is asserted by any of the read/write stacks.

One solution for achieving tight threshold voltage distributions, without unreasonably slowing down the programming process, includes a quick pass write technique using a two-phase programming process. The first phase, a coarse or quick programming phase, includes an attempt to raise a threshold voltage in a faster manner while paying less attention to achieving a tight threshold voltage distribution. The second phase, a fine or final programming phase, attempts to raise the threshold voltage in a slower manner in order to reach the target threshold voltage, thus achieving a tighter threshold voltage distribution. One example of a coarse/fine programming methodology can be found in U.S. Pat. No. 6,643,188.

FIGS. 12 and 13 provide more detail of one example of a quick pass programming methodology. FIGS. 12A and 13A depict the programming pulses Vpgm applied to the control gate. FIGS. 12B and 13B depict the bit line voltages for the memory cells being programmed. FIGS. 12C and 13C depict the threshold voltage of the memory cells being programmed. This example of FIGS. 12 and 13 depicts programming of memory cells to state A using two verify levels, indicated in the FIGS. as VvA1 and VvA. The final target level is VvA. When a threshold voltage of the memory cell has reached VvA, the memory cell will be inhibited from further programming by applying an inhibit voltage to the bit line corresponding to that memory cell. For example, the bit line voltage can be raised to Vinhibit (See FIG. 4B and FIG. 5B). Vinhibit is typically a supply voltage VDD (e.g., 2.5V). However, when a memory cell has reached a threshold voltage close to (but lower than) the target value VvA, the threshold voltage shift of the memory cell during subsequent programming pulses is slowed down by applying a certain bias voltage to the bit line, typically on the order of 0.3 v to 0.8 v. Because the rate of threshold voltage shift is reduced during the next few programming pulses, the final threshold voltage distribution can be narrowed. To implement this method, a second verify level that is lower than that of VvA is used. This second verify level is depicted in FIGS. 12 and 13 as VvA1. When the threshold voltage of the memory cell is larger than VvA1, but still lower than VvA, the threshold voltage shift to the memory cell will be reduced for subsequent programming pulses by applying a bit line bias Vs (FIG. 13B). Note that in this case, two verify operations are required for each state. One verify operation at the corresponding final verify level (e.g., VvA) for each state to which the quick pass write methodology is applied, and one verify operation at the corresponding second verify level (e.g., VvA1) for each state. This may increase the total time needed to program the memory cells. However, a larger ΔVpgm step size can be used to speed up the process.

FIGS. 12A, 12B, and 12C show the behavior of a memory cell whose threshold voltage moves past VvA1 and VvA in one programming pulse. For example, the threshold voltage is depicted in FIG. 12C to pass VvA1 and VvA in between t2 and t3. Thus, prior to t3, the memory cell is in the coarse or quick programming phase. After t3, the memory cell is in the inhibit mode.

FIGS. 13A, 13B, and 13C depict a memory cell that enters both the coarse and fine programming phases. The threshold voltage of the memory cell crosses VvA1 in between time t2 and time t3. Prior to t3, the memory cell is in the coarse or quick phase. After t3, the bit line voltage is raised to Vs to place the memory cell in the fine or final phase. In between t3 and t4, the threshold voltage of the memory cell crosses VvA. Therefore, the memory cell is inhibited from further programming by raising the bit line voltage to Vinhibit.

Figure 14A:
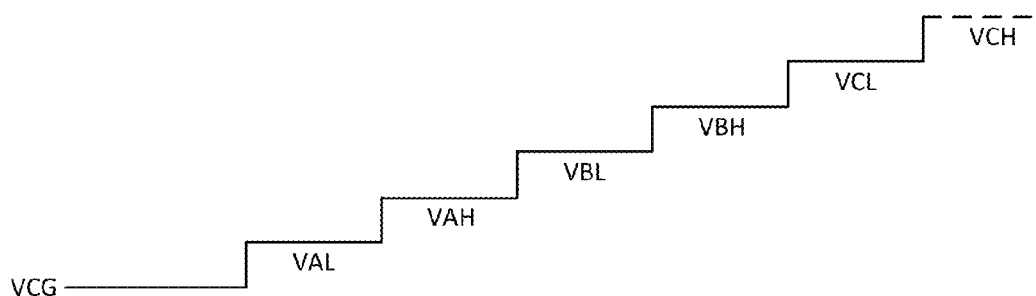
FIGS. 14A-14B illustrate waveforms for different ways of implementing a verify operation in quick pass write.
Figure 14B:
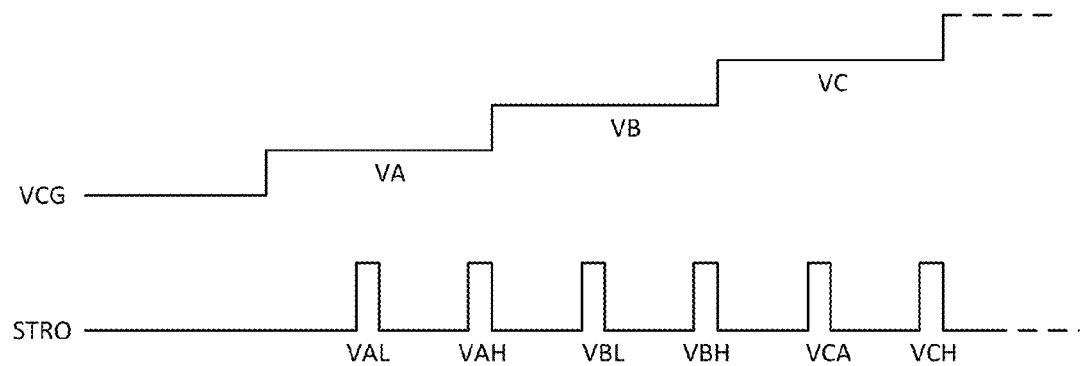

Accordingly, the bit lines are of three groups: a first group to be inhibited; a second group to be programmed; and a third group to be slow programmed (or partially inhibited). In a first step, the first group is taken to a value offset some below the high level, VDDSA-ΔV, where the offset can be a settable parameter. For example, if VDDSA=about 2.5V and ΔV is about 0.7V, this would be about 1.8V. The second group pre-charged, then left to float at 0V. The third group is set to a low value, say .about. 0.7V, then left to float. At the second step (see (6) below), the first group is taken to the high level, while the bit lines of groups 2 and 3 will get coupled up if the bit line is adjacent to a bit line of group 1. FIG. 14A illustrates a typical set of word line waveforms for a common implementation of quick pass write (QPW) and FIG. 14B illustrates an alternate approach. FIG. 14A is a schematic illustration of a QPW verify control gate waveform. Here, the memory cells can be program from a ground or erased state into states A, B, C, and so on. After a programming pulse, each cell is verified for the different levels and, if the cell verifies at its target level, it is inhibited from further programming. In a QPW program, each verify level is split in two: a low verify and a high verify. For example, the A state is now verified for the low level VAL and high level VAH, and similarly for the other states. When a cell verifies at the high level for its target state, it is fully inhibited, while if it verifies at the low level of its target state it is partially inhibited to slow, but not stop programming. (For more discussion of the quick pass write concept, see U.S. Pat. No. 7,345,928).

Figure 15:
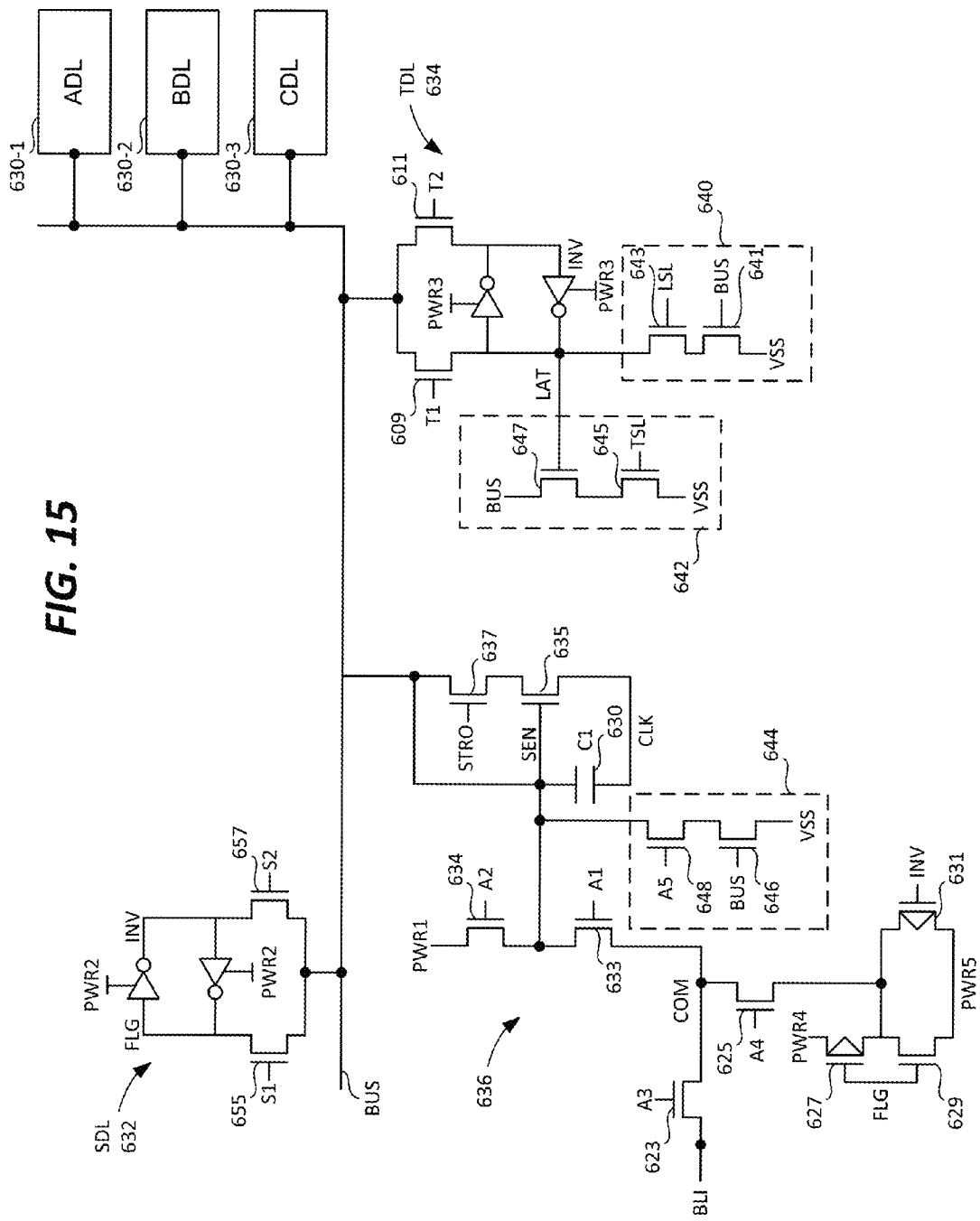
FIG. 15 illustrates schematically an exemplary embodiment of a sense amplifier circuit.

The approach of FIG. 14B shows a slightly different approach. In a sense operation, a bit line is pre-charged, a sensing voltage placed on its control gate and then after a period of time, the amount of discharge is checked. In the arrangement of FIG. 14B, only one control gate voltage (VCG) is used for each state, so that, for example, VA in FIG. 14B would correspond to the high level VAH of FIG. 14A and similarly for other states; but now, for each level, the discharge level is checked twice in relatively quick succession. These two sense operations then correspond to the low and high verify levels, hence the notation ~VAL, ~VAH, and so on. The bottom line shows the strobe waveform as applied to STRO 637 (FIG. 15). This first time STRO goes high is to set the QPW latch data and the second time to update the program data, both being done from the same discharge. In FIGS. 25A and 25B the time scales are not meant to correspond, being schematic in both cases.

Traditionally, a coarse/fine or quick pass write (QPW) programming technique uses a dedicated data latch to statically hold a result of the low level sensing. For example, when sensing at the low level for the target state of a bit line, the sense amplifier will write a first logical value to the QPW data latch to indicate that the cell has been programmed above the low level and a second logical value to indicate that it has not. If the cell is verified at the lower level but not subsequently at the higher final verify level, the sense amplifier will access the QPW data latch to set the intermediate voltage on the bit line for programming at the reduced level for programming.

The use of a dedicated static data latch to hold QPW information consumes a considerable amount of space on a die when forming a memory. Additionally, calculating the QPW information using dedicated SCAN operations may increase verification times. Accordingly, a sense amplifier is described utilizing a combination of static and dynamic data latches to efficiently process QPW information while maintaining minimum die sizes. A combination of static and dynamic data latches, along with local SCAN logic circuitry, enables an efficient use of the die while maintaining performance by avoiding extra timing penalties, etc.

FIG. 15 depicts an arrangement of a sense module 480 and data latches that form part of read/write circuitry in accordance with one embodiment. FIG. 15 represents a compact and versatile sense amplifier or sense amp that includes a small number of data latches for performing a number of memory operations including SCAN operations whereby the results of sensing are used in logic operations, for example to combine data from different user data latches or with other data. In particular, the arrangement of FIG. 15 permits AND, OR, and Xor Operations to support quick pass write (QPW) techniques, whereby cells along a given word line selected for programming can be enabled, inhibited, or partially inhibited for programming. The sense amplifier may set three different bit line levels used in the QPW technique using dynamic latches and data shifting within the sense amplifier. The operations are supported while using a small number of data latches so that die size can be reduced. The sense amplifier is capable of pre-charging bit lines while doing data scanning to combine sense results with program data from user data latches.

The sense amplifier circuitry includes a first data latch SDL 632 which is coupled to a central bus BUS for controlling a corresponding bit line. The SDL data latch may be referred to as a sense data latch, and includes internal nodes FLG and INV for controlling the bit line during reading and programming based on an BUS value. The SDL data latch 632 is a static data latch. A second data latch TDL 634 is provided having a static data latch portion, similar to SDL, as well as a first SCAN circuit 640 and a second SCAN circuit 642. Three user data latches ADL (630-1), BLD (630-2) and CDL (630-3) are depicted in FIG. 15 with connection to the sense amplifier circuitry over the central bus BUS. Data latches ADL, BDL, and CDL are static data latches used to hold user data for programming to a memory cell or that is read from a memory cell at the corresponding bit line. Three user data latches may store 3-bits of user data to support an eight state coding scheme. Three user data latches are presented as an example but any number of user data latches may be used according to the data coding of a particular implementation.

The sense amp circuit can be connected to a bit line at BLI and to the BUS. The input signal CLK is received and can be supplied at the lower plate of the capacitor C1 631. The sense amplifier is then also connected to a high voltage power supply PWR4 and ground or VSS.

The first latch circuit SDL 632 has a first node FLG and a second node INV, where these nodes are coupled to a pair of series connected amplifiers. The level on the node FLG can then be connected to the BUS through the switch 655 with control signal S1. The level on the node INV can be connected to BUS through the switch 657 with control signal S2.

The second data latch TDL 634 includes a static latch portion as well as latch scan circuitry to support quick pass write operations. The static latch portion includes a first leg with node LAT and a second leg with node INV, where the nodes are coupled to a pair of series connected amplifiers The level on the node LAT can be connected to the BUS through the switch 609 with control signal T1 and the opposite level on the node INV can be connected to BUS through the switch 611 with control signal T2.

The first latch scan circuit 640 in TDL 634 has an upper node connected to node LAT within the static data latch portion and a lower node connected to ground or VSS. The upper node connects to a first transistor 643 forming a switch having a gate controlled by control signal LSL. The first transistor is in series with a second transistor 641 having forming a switch having a gate controlled by BUS. In this manner, the level at node LAT may be combined with the level of LBUS to perform logic operations as part of a SCAN during quick pass write. When BUS is high, any voltage at LAT will drain to ground. When BUS is low, the value of LAT is held at its original level. This permits a SCAN operation to be performed while writing the value to the TDL data latch. Accordingly, the first latch circuit permits the value of TDL 634 to be used in a logic operation with the BUS value as shown in Equation 1.

$$LAT = LAT \text{ AND } \overline{BUS} \qquad \text{Equation 1}$$

The second SCAN circuit 642 in latch circuit 634 has an upper node connected to BUS and a lower node connected to VSS. The upper node connects to a first transistor 647 forming a switch having a gate controlled by the value at node LAT of the static data latch portion of TDL. The first transistor is in series with a second transistor 645 forming a switch having a gate controlled by control signal TSL. In this manner, the level at node BUS may be combined with the level of LAT to perform additional logic. When LAT is high, any voltage at BUS will drain to ground. When LAT is low, the value of BUS is held at its original level. Accordingly, the second latch circuit permits the value of BUS to be used in a logic operation with the data latch value of TDL as shown in Equation 2.

$$BUS = BUS \text{ AND } \overline{LAT} \qquad \text{Equation 2}$$

In between the bit line BLI and the latches SDL 632 and TDL 634 is the bit line selection and intermediate circuitry of the sense amp. The bit line BLI can be selectively connected to the node COM by use of the selection switch 623 controlled by A3. The node COM can also be connected to the high supply level PWR4 by the switch 625 controlled by A4 and by use of the PMOS switch 627. Switch 627 is controlled by FLG. Switch 629 is also controlled by FLG and is connected in series with PMOS switch 631, controlled by INV.

The internal sense node SEN can be connected to, or isolated from, the COM node by the device 633 controlled by A1. The top plate of the capacitor C1 630 is also connected to the internal SEN node of the sense amp. In addition to being connected to the bottom plate of C1 630, the CLK signal is also connected to the BUS by way of the transistor 635, whose gate is connected to the SEN node, connected in series with the independently controllable device STRO 637. The SEN node may be connected to a voltage supply PWR1 through the device 634 controlled by A2.

A third SCAN circuit 644 is provided having an upper node connected to the dynamic sense node SEN and a lower node connected to VSS or ground. The upper node connects to a first transistor 648 forming a switch having a gate controlled by control signal A5. The first transistor is in series with a second transistor 646 forming a switch having a gate controlled by BUS. In this manner, the level at the SEN node may be combined with the level of BUS to perform logic operations as part of a SCAN during quick pass write. When BUS is high, any voltage at SEN will drain to ground. When BUS is low, the value of SEN is held at its original level. Accordingly, the first latch circuit permits the value of the SEN node to be used in a logic operation with the BUS value as shown in Equation 3.

$$SEN = SEN \text{ AND } \overline{BUS} \qquad \text{Equation 3}$$

The arrangement of the elements in FIG. 15 includes the ability to pre-charge a bit line concurrently with a data transfer or SCAN operation that applies logic to the sense results. During the bit line pre-charge through the bit line select switches, the COM node may stay at the power supply voltage level. During data transfer, the data information from the FLG node or LAT node may be sent to the BUS node. A bit line can be pre-charged at the same time as data transfer happens.

The arrangement of FIG. 15 allows for the three bit line values (allow, inhibit, partial inhibit) of the quick pass write (QPW) to be forced using a dynamic latch arrangement and data transfer process. In a two bit line forced program arrangement, INV is '0' and FLG is '1' for a programmed bit line. PWR5 is equal to VSS. In a first step, the programmed bit line is connected to PWR5 through switches 625 and 631 and the inhibited BL is connected to PWR4. In a second step, quick pass write data is scanned into SDL so FLG is equal to 1, while switch 625 lower downs the value to VQPW_BL+VT.

The arrangement in FIG. 15 may operate in a no-lockout mode by placing switch 625 on by signal B2, PWR5 to VDDSA, and driving the COM node without regard to the data pattern. A second mode of operation is a lockout read/program verify mode. Although a somewhat more involved process than the more common no-lockout read, lockout read will draw less current as once a cell generates a positive read result (FLG high), it is removed from further sensing. Note that this is a lockout from further sensing in a series of sensing operations, as opposed to a programming lockout. For example, in multi-state memory a sensing operation, whether for a data read, program-verify, or other reason, will often include a series of sense operation. Putting this in the context of the exemplary embodiment, a series of sense operations will include checking the memory cell's state against a number of reference parameter by, in this example, pre-charge the cell's bit line, applying a sensing voltage to the word line, and seeing if the bit line discharges through the cell. This is done for a series of increasing sensing voltages corresponding to differing states. However, if a cell conducts enough to discharge the bit line at, say, the second sensing voltage, repeating the process again at a third, higher sensing voltage will supply no additional information, but only serve to waste the current used for it and any subsequent sensings; hence, the read lockout. A lockout read may be implemented by placing switch 625 on. If INV is equal to PWR4, the bit line is locked out from sensing. If INV is 0V, the bit line voltage will be sensed. The circuit may also operate in hybrid lockout mode for sensing. Both Quick Pass Write (QPW) and lock-out sensing have been discussed above. Hybrid lockout sensing is a mixture of these ideas, in that the bit line is locked out after verify at the high verify level of a state, but not locked out between verifying at the low and high verify levels of a state; that is, bit lines are locked out between different states, but not between the low and high verify levels of each state. This hybrid mode can provide no-lockout verify programming performance with lockout program current level.

Figure 16:
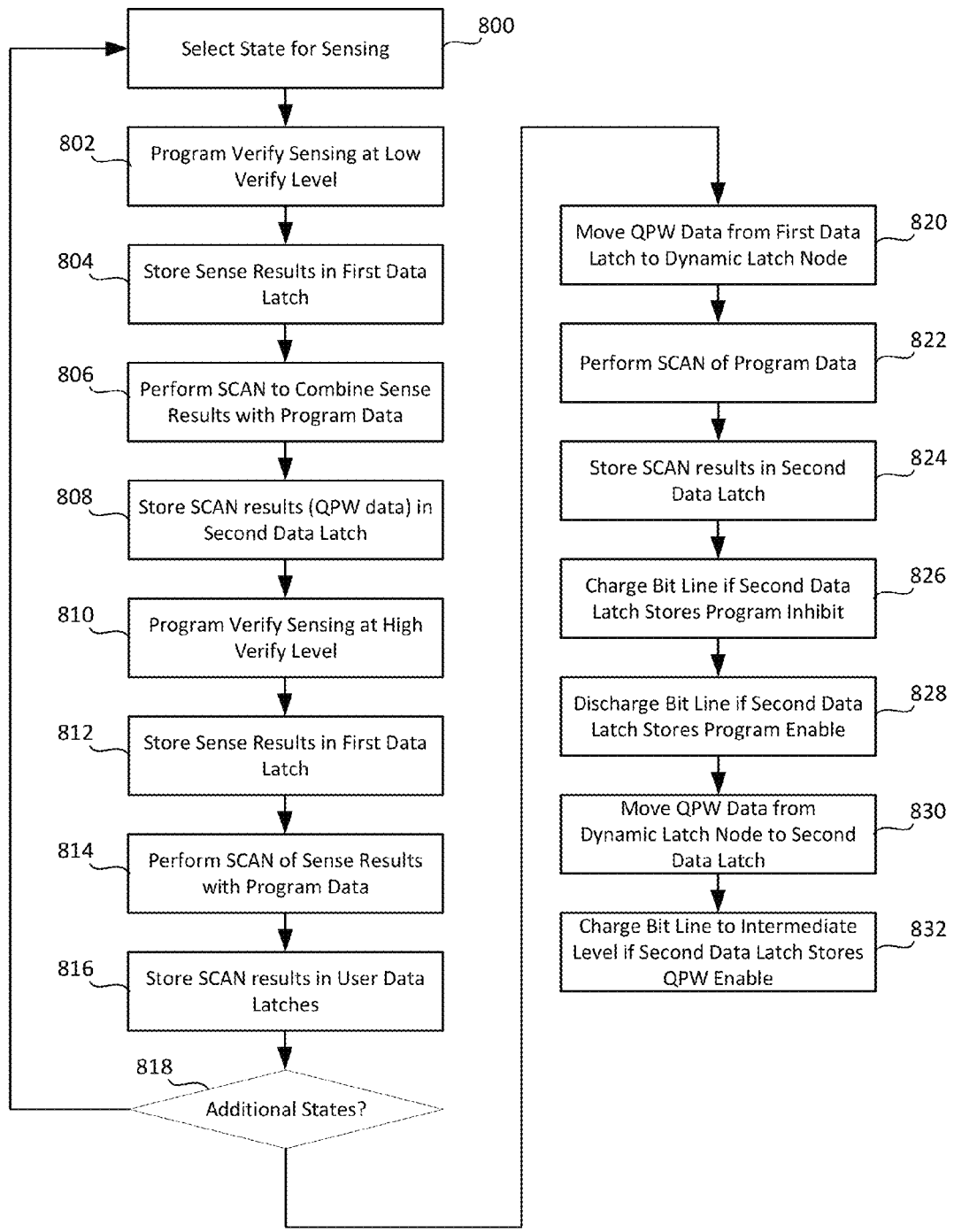
FIG. 16 is a flowchart describing a process of verification in quick pass write according to one embodiment.

FIG. 16 is a flowchart describing a process of program verification using sense amplifier circuitry with an efficient data latch structure to support three levels of programming for memory cells along a word line. FIG. 16 demonstrates verification for a quick pass write programming technique that sets three different bit line voltage levels based on a lower level and higher level verification for each state. In FIG. 16, a process of program verification according to one embodiment is depicted using the sense amplifier circuitry as shown in FIG. 15.

A first state is selected for sensing at step 800. At step 802, program verify sensing is performed at a low verify level for the selected state. For example, step 802 may include applying a low verify voltage to a selected word line and sensing the bit line voltage, or applying a final verify voltage and sensing the bit line voltage after a first time period following the pre-charge of a bit line in various embodiments. At step 804, the results of sensing at the low verify level are stored in a first data latch such as TDL 634. At step 806, a SCAN operation is performed to combine the results of sensing at the low verify level with the program data being stored in a set of user data latches. In one embodiment, logic circuitry local to the first data latch is used to perform the SCAN operation by performing an 'AND' operation of the sense results with the program data in the user data latches. The AND operation is selective for the state being sensed. The coding of the selected state is applied so that the SCAN operation only generates a positive value (e.g., logic '1') when the program data matches the state being sensed and the results of sensing are positive. In this manner, the sense amplifier generates QPW or coarse level programming data for those bit lines targeting the selected state. The SCAN results are negative (e.g., logic '0') for each other state, or for those bit lines targeting the selected state that do not generate positive sensing results. At step 808, the sense amplifier writes the results of the SCAN operation to a second data latch such as SDL 632. The second data latch contents are thus updated for the selected state to store the QPW data.

At step 810, the sense amplifier performs program verify sensing at a high verify level for the selected state. As with the low verify level sensing, high verify level sensing may be performed by applying a high verify voltage for the selected state to the selected word line in one embodiment. In another embodiment, a final verify voltage is used for both high and low verify level sensing but a longer sense period is used for the high level sensing. At step 812, the results of sensing at the high verify level are stored in the first data latch.

At step 814, a second SCAN is performed to combine the results of sensing at the high verify level with the program data being stored in the set of user data latches. Like the SCAN operation at step 806, logic circuitry local to the first data latch can be used to perform the SCAN operation by performing an 'AND' operation of the sense results with the program data in the user data latches. The AND operation is selective for the state being sensed by applying the coding of the selected state to the user data latch contents. In this manner, the sense amplifier generates a result for those bit lines targeting the selected state. A positive SCAN result (e.g., logic '1') is generated for each user data latch when the program data matches the selected state and the high verify level sensing is positive. The SCAN results are automatically negative (e.g., logic '0') for each non-targeted state by applying the coding of the selected state to each user data latch. The SCAN results are also negative for those bit lines targeting the selected state that do not generate positive sensing results. At step 816, the SCAN results are written to the user data latches. The SCAN results will only be written to user data latches matching the selected state. For example, a logic '1' can be written to a user data latch when its contents match that of the selected state and the sense results are positive. A logic '0' can be written when the data latch contents do not match the targeted state, or the sense results are negative. In one embodiment, steps 814 and 816 include writing the erased state coding (e.g., '111' in FIG. 8) to the user data latches when sensing is positive and the user data latches match the selected state. In this manner, programming will be inhibited for the bit line during the next programming iteration.

At step 818, the memory determines whether sensing is to be performed for additional states. If so, the process returns to step 800 to select the next state for sensing. If sensing has been completed for each state, the QPW data being stored in the second data latch is moved to a dynamic latch node at step 820. Step 820 frees the second data latch to control the bit line voltage during the programming sequence. At step 822, the sense amplifier SCANS the user data latch contents for program or program inhibit data. For example, the sense amplifier may determine which user data latches are storing erased state data (e.g., '111') indicating that the corresponding bit line should be inhibited during programming. At step 824, the sense amplifier writes the result of the SCAN operation to the second data latch. In one example, the sense amplifier writes a first logic state (e.g., logic '0') when the user data latches store erased state data so that the bit line will be inhibited. The sense amplifier writes a second logic state (e.g., logic '1') when the user data latches store any other state coding so that the bit line will be programmed.

After writing the SCAN result to the second data latch, the bit line is charged at step 826 if the first data latch is in a first logic state (e.g., logic '1'), indicating that the bit line should be inhibited. At step 828, the bit line is discharged if the second data latch is in a second logic state (e.g., logic '0'), indicating that the bit line should be programmed. After using the second data latch to set the bit line level for program or program inhibit, the contents of the dynamic latch node are moved back to the second data latch at step 830. In this manner, the second data latch stores the QPW data after the user data has been processed and used to set the initial program enable or inhibit value. At step 832, the sense amplifier charges the bit line to an intermediate level from ground if the second data latch stores a first logic value indicating QPW enable. If the second data latch stores a second logic value, the bit line remains at the initial level set at step 826 for program inhibit or step 828 for full programming.

As steps 820-832 indicate, a static data latch is not dedicated for maintain the QPW data throughout the programming sequence. Instead, the QPW data is moved from the static second data latch to a dynamic latch node at the beginning of the programming sequence. The second data latch can then be used to set the level for program enable or program inhibit to the bit line based on the user data latches. After setting the program enable or program inhibit level, the QPW data can be moved back to the second data latch to set the program enable bit lines to an intermediate level for quick pass write programming at a reduced level from full programming based on the second data latch.

In one embodiment, the QPW data can be moved from the second data latch to the first data latch for longer maintenance. The QPW data can be moved directly from the second data latch to the first data latch after sensing at all states, or from the SEN node after transfer as shown at step 830.

Figure 17:
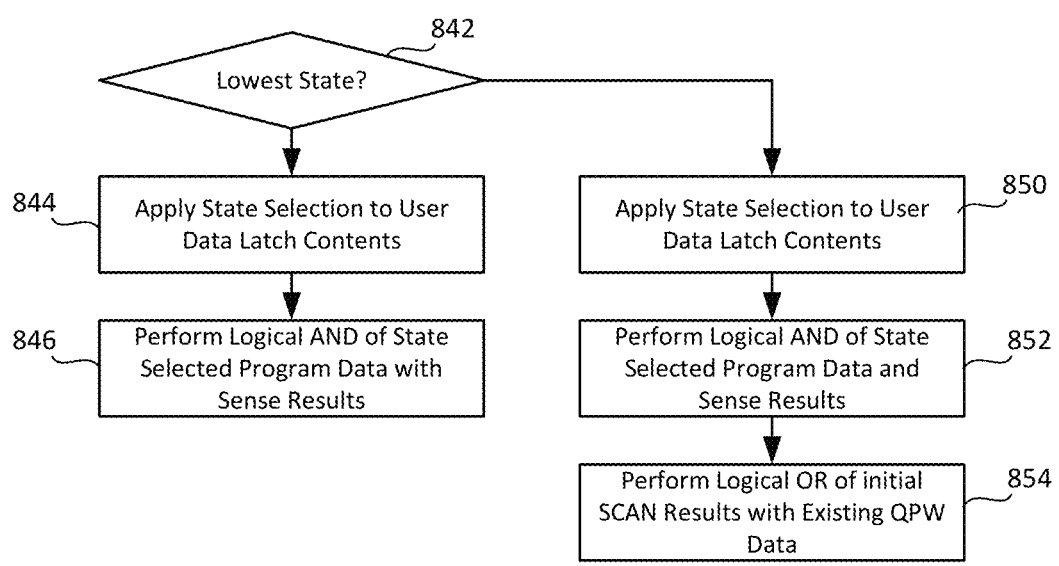
FIG. 17 is a flowchart describing a process of scanning low verify sensing results to generate quick pass write data.

FIG. 17 is a flowchart describing a process of performing a SCAN operation to generate QPW information according to one embodiment. In one example, the process of FIG. 17 may be used at step 806 of FIG. 16 to combine sense results from low level sensing with program data from a set of user data latches. At step 842, the process at the sense amplifier branches based on the current state being sensed. If the lowest level state is being sensed, the process proceeds at step 844. The state machine applies state selection to the program data in the set of user data latches that indicate a target state. For example, if the current state being sensed is state 'A' having a coding of '011', the sense amplifier selects $\overline{A}*B*C$ from the set of user data latches ADL, BDL, CDL. At step 846, the sense amplifier combines the state selected program data with the sense results. The sense amplifier uses a logic AND to combine the state selected content of each data latch with the sense results. In this manner, a first logic value is generated when the set of user data latches match the selected state and the results of sensing are positive. A second logic value is generated when either the user data latches do not match the selected state or the results of sensing are negative. For example, if the currently selected state is state A, the sense amplifier can combine the sensing result from output of the second data latch (e.g., TDL) with the output of the user data latches ADL, BDL, CDL as shown in Equation 4.

$$\text{SCAN}=TDL*\overline{ADL}*BDL*CDL \quad \text{Equation 4}$$

If the lowest level state is not being sensed, the process proceeds at step 850. The sense amplifier again applies state selection to the program data in the set of user data latches. At step 852, the sense amplifier combines the state selected program data with the sense results as described at step 846. The sense amplifier combines these initial SCAN results with the currently held contents of the second data latch at step 854. A logical OR operation is used in one embodiment so that once a state-specific QPW flag is set for the target state, it will not be overwritten. In this manner the QPW information for a targeted state can be maintained in the second data latch after sensing for other non-targeted states. Once the second data latch is written to enable QPW programming for the targeted state of the bit line using logic '1', that data will be maintained as sensing progresses. The results of the SCAN at higher non-targeted states will be combined using the OR operation with logic '1' so that the second data latch maintains the QPW information for the target state.

Figure 18:
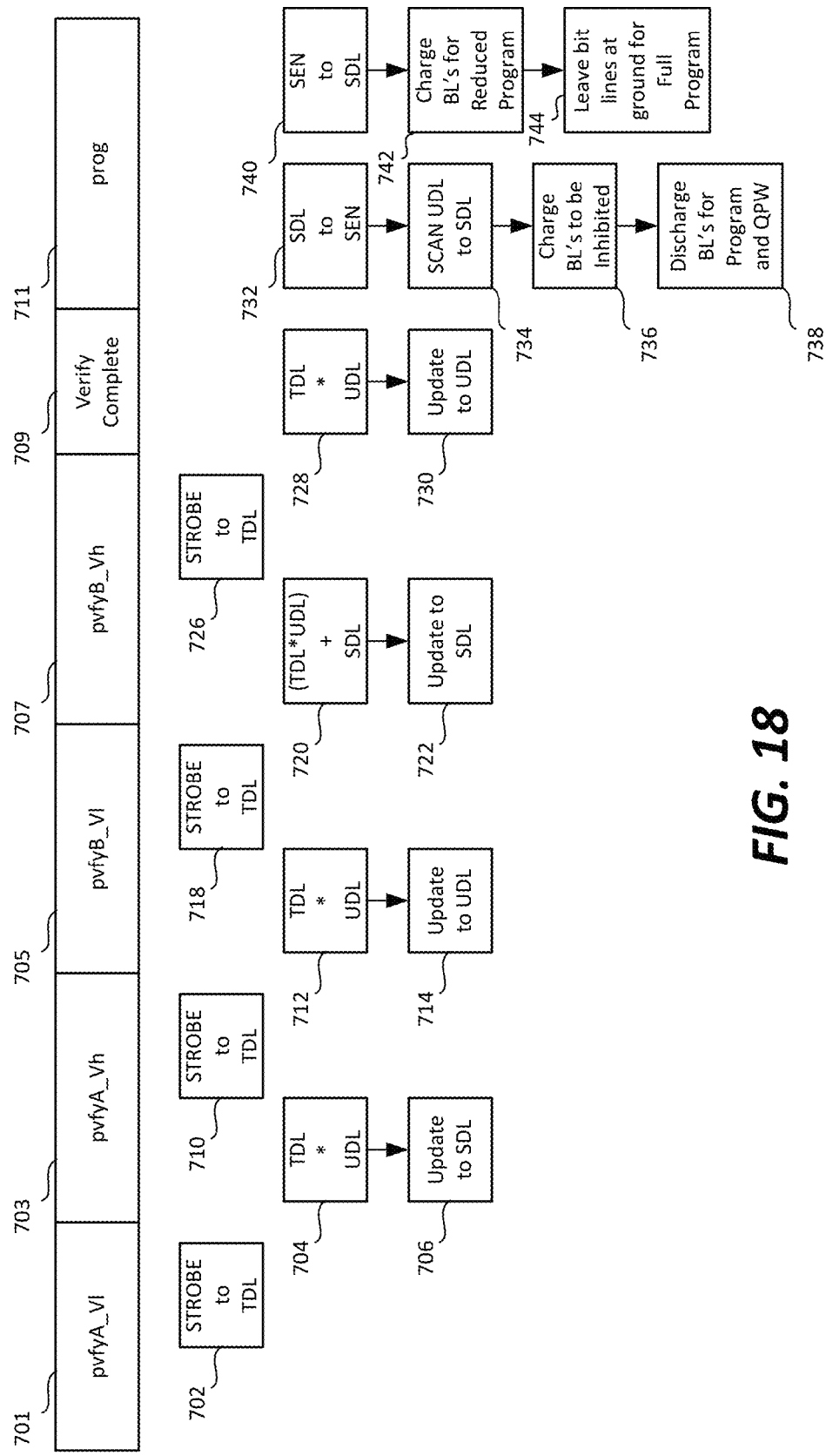
FIG. 18 illustrates a block diagram of a program and verification sequence according to one embodiment.

FIG. 18 is a block diagram describing a specific example of a quick pass write operation to illustrate select features of the sense amplifier circuitry of FIG. 15. FIG. 18 demonstrates verification for quick pass write programming that sets three different bit line voltage levels based on a lower level and higher level verification for each state. Block 701 depicts a first sensing operation pvfyA_V1 for program verification at the low verify level V1 for a first programmed state A. Sensing may be performed by applying a low verify voltage V1 to the selected word line as shown in the technique of FIG. 14A or by applying a final verify voltage and sensing with a shorter sense period as shown in the technique of FIG. 14B. Sensing may include precharging the bit lines and determining whether the voltage at the SEN node for the corresponding sense amplifier remains at the precharge level indicating that the corresponding cell has been programmed above the verification level. In this manner, a sensing result of logic '1' indicates a cell programmed above the verify level and a sensing result of logic '0' indicates a cell not programmed above the verify level.

Block 703 depicts a second sensing operation pvfyA_Vh for program verification at the high verify level Vh for state A. Block 705 depicts a third sensing operation pvfyB_V1 for program verification at the low verify level V1 for state B. Block 707 depicts a fourth sensing operation pvfyB_Vh for program verification at the high verify level Vh for state B. Although two states are depicted in FIG. 18, additional sensing operations can be performed for each of the programmed states of a memory in a given implementation.

The sensing result of pvfyA_V1 is strobed or otherwise written to the TDL data latch 634 as shown at box 702. After strobing the results of pvfyA_V1, sensing at the high verify level for state A begins as shown in box 703. While charging the SEN node, a SCAN operation is performed based on the results of the sensing at the low verify level. The contents of the TDL data latch 634 are combined with the contents of the user data latches ADL, BDL, CDL (collectively referred to as UDL hereinafter for convenience) in a SCAN operation as shown at box 704. Specifically, the sense results are combined with the user data latches to establish the quick pass write data for the A-state memory cells. For example, the sense result in the TDL data latch can be combined with each of the user data latches using an "AND" operation (denoted as * in the drawings) selective for the A-state encoding in box 704. By combining the sense results with the user data latches, the results of sensing can be selected for the memory cells to be programmed to the currently selected state being sensed. With reference to the encoding in FIG. 8 for example, the A state is encoded as "011." Accordingly, the sense results in TDL (node LAT) would be combined in an "AND" operation with the values in ADL, BDL, and CDL using Equation 4.

After processing the sense results in a SCAN operation with the user data, the SDL data latch is updated with the SCAN results as shown at box 706. Like the scan operation, the results are written to the SDL data latch while charging the SEN capacitor for sensing at the high verify level for state A. The SCAN results represent the QPW information for the A-state targeted memory cells. For example, where the sensing result is positive (logic '1'), SDL is updated to logic '1' for those bit lines where data latches ADL, BDL, and CDL store the combination "011." In this manner, the SDL data latch holds the QPW information for the A state sensing. Logic "1" is stored if the cell has passed the low verify level and logic "0" is stored if the cell has not passed the low verify level or is to be programmed to a higher level state.

After the SEN node has been charged, and the SCAN operation has completed using the contents of TDL at 704 and 706, sensing is performed at the high verify level Vh for state A. The results of sensing are strobbed to the TDL data latch as shown at box 710. After strobing the results of pvfyA_Vh, the sense operation at the low verify level for state B begins as shown at box 705. While charging the SEN node, a SCAN operation is performed based on the results of sensing at the high verify level. The contents of the TDL data latch 634 are combined with the contents of the user data latches UDL in a SCAN operation as shown at box 712. The results of sensing at the high verify level for state A are combined with the user data latches to establish lockout information for the next programming iteration for the targeted A-state memory cells. For example, the sense result in the TDL data latch can be combined with each of the user data latches using an "AND" operation selective for the A-state encoding. By combining the sense results with the user data latches, the results of sensing can be selected for the memory cells to be programmed to the currently selected state. With reference to the coding in FIG. 8 for example, the A state is encoded as "011." The sense results can again be combined in an "AND" operation with the values in ADL, BDL, and CDL using Equation 4.

During the SEN capacitor charge time, the results of the SCAN operation using the high verify level sensing are used to update the user data latches ADL, BDL, and CDL as shown at box 714. The SCAN results from high level sensing represent the lockout information for the A-state targeted memory cells during the next programming iteration. If the bit line has a positive sensing result, the user data latches currently storing A state information (e.g., "011") are flipped during the SCAN operation to indicate the erased state (e.g., 111 in FIG. 8). In this manner, the user data latches for the currently selected state will hold state E information when the memory cell has a positive sensing result. These memory cells will be locked from programming during the next programming iteration.

After the SEN node has been charged, and the SCAN operation has completed using the contents of TDL at 712 and 714, sensing is performed at the low verify level V1 for state B as shown in box 705. The results of sensing are strobbed to the TDL data latch as shown at box 718.

After strobing the results of pvfyB_V1, the sense operation at the high verify level for state B begins as shown at box 707. While charging the SEN node, a SCAN operation is performed based on the results of sensing at the low verify level. The contents of the TDL data latch 634 are again combined with the contents of the user data latches UDL in a SCAN operation as shown at box 720. The SCAN at box 720 combines the sense results with the user data latches to establish the quick pass write data for the B-state memory cells. For example, the sense result in the TDL data latch can be combined with each of the user data latches using an "AND" selective for the B-state coding in box 720 in an initial SCAN. With reference to the encoding in FIG. 8 for example, the B state is encoded as "001." Accordingly, the sense results in TDL (node LAT) would be combined in an "AND" operation with the values in ADL, BDL, and CDL using Equation 5:

$$\text{SCAN} = TDL \text{ AND } \overline{ADL} \text{ AND } \overline{BDL} \text{ AND } CDL \qquad \text{Equation 5}$$

In order to maintain the QPW information in the SDL data latch for the state A targeted memory cells, the results of the initial SCAN are then combined with the existing data in the SDL data latch using an OR operation. In this manner, any QPW information for the A state will be maintained in the SDL data latch if already existing (logic '1'). If QPW is not already being held by SDL, the initial SCAN results from box 720 are maintained.

After processing the sense results in a SCAN operation with the user data, the SDL data latch is updated with the SCAN results as shown at box 722. The initial SCAN results represent the QPW information for the B-state targeted memory cells. Accordingly, where the sense result is positive (logic '1'), SDL is updated to logic '1' for those bit lines where data latches ADL, BDL, and CDL store the combination "001." Where the sense result is negative (logic '0'), and SDL is already storing logic '0', SDL remains at logic '0.' Where the sense result is negative, but SDL is currently storing logic '1,' SDL is rewritten to logic '1' due to the OR operation. In this manner, the SDL data latch holds the QPW information for the A state sensing and B state sensing where appropriate following box 722.

After the SEN node has been charged, and the SCAN operation has completed using the contents of TDL at 720 and 722, sensing is performed at the high verify level Vh for state B as shown in box 707. The results of sensing are then strobbed to the TDL data latch as shown at box 726. After strobing the results of pvfyB_Vh, the verify operation completes at box 709 in order to transition to the next programming iteration. Where additional states are to be sensed, the process shown for state B is repeated until sensing for all states is completed.

A SCAN operation is performed to combine the contents of the TDL data latch 634 with the contents of the user data latches UDL at box 728. The results of sensing at the high verify level for state B are combined with the user data latches to establish lockout information for the next programming iteration for the targeted B-state memory cells.

In box 730, the results of the SCAN operation using the high verify level sensing are used to update the user data latches ADL, BDL, and CDL. The SCAN results from high level sensing represent the lockout information for the A-state targeted memory cells during the next programming iteration. If the bit line has a positive sensing result, the user data latches currently storing B state information are flipped during the SCAN operation to indicate the erased state. In this manner, these memory cells will be locked from programming during the next programming iteration.

With sensing complete, the sense amplifier begins the programming process at box 711. Because the SDL data latch is used to control the bit line voltage during programming, the QPW information is transferred out of the SDL data latch prior to programming. At box 732, the contents of the SDL data latch are moved to the dynamic SEN node. Once the QPW information is moved from the SDL data latch to the SEN node, a SCAN operation is performed at step 734 to move the user data to the SDL latch. The contents of the user data latches are scanned to determine if they indicate anything any state other than the erased state (e.g., any latch storing logic '0'). If so, the corresponding SDL data latch is set to logic '0' to set up the corresponding bit line for programming. If the contents of the user data latches indicate the erased state, the corresponding SDL data latch is set of logic '1' for programming inhibit.

Having set the SDL data latch according to the user data latches, the bit lines are initially set up for the next programming iteration as shown at boxes 736 and 738. At box 736, bit lines to be inhibited from programming during the next programming iteration are charged to the program inhibit level (e.g., PWR4). At box 738, bit lines that are to be fully programmed or that are to be programmed at the reduced QPW level are discharged to ground at step 738.

Having set the initial level for the bit lines based on the user data at box 736 and 738, the QPW data stored as the contents of the SEN node are scanned to the SDL data latch at box 740. If the SEN node is storing logic '1' indicating that QPW (reduced) programming should be enabled, SDL is set to logic '1.' If the SEN node is storing logic '0' indicating that QPW programming should not be enabled, SDL is set to logic '0.' At box 742, the bit lines whose sense amplifiers are storing logic '1' in SDL are charged from ground to the reduced programming level for QPW programming. At box 742, the bit lines whose sense amplifiers are storing logic '0' in SDL remain at 0V for full programming during the next iteration.

Accordingly, the non-volatile memory can provide an efficient data latch structure for programming bit lines using at least three programming levels. A sense amplifier includes a first data latch for controlling the voltage of a corresponding bit line, and a second static data latch with scan circuitry for performing logic operations on the program data and sense results. The sense amplifier scans low verify sense results with program data to generate reduced programming data. The reduced programming data is transferred out of the first data latch after sensing for all states and the program data is scanned to generate program enable/inhibit data which is stored in the first data latch. After setting the bit line to a program inhibit or program enable level, the reduced programming data is transferred back to the first data latch. The bit lines for reduced programming are then adjusted to the reduced programming level.

In traditional lockout operations, the results of sensing may be used to lockout memory cells from additional sensing once a memory cell generates a positive read result. For example, if a memory cell generates a negative read result when sensing at the A-state, additional sensing at the B-state, C-State or higher level states may be skipped because such sensing will not provide additional information. The higher verify levels applied at the higher level states will only serve to further turn on the memory cell which was determined to be conductive at the lower A-state.

While lockout measures may draw less current during sense operations, their implementation often requires operations that increase sense times. The lockout information is determined using a scan operation that applies logic to the sense results. The scan operations following sensing may harm performance by increasing the overall time required for sensing.

In accordance with one embodiment, a state dependent lockout is provided that limits sensing based on the target state of the memory cell. The sense amplifier may skip sensing when performing verification at non-targeted states. The lockout information is determined by the sense amplifier prior to sensing. In this manner, a traditional scan operation following sensing to determine lockout information for sensing at the next state can be avoided. Instead, the sense amplifier applies state-specific coding to the program data prior to sensing. A scan operation may be performed during the time before sensing, thus avoiding the time to perform a scan operation following sensing that is typically used. Overall, the total time used for the scan operation is reduced during sensing.

In FIG. 15, the third latch scan circuit 644 includes an upper node connected to the SEN node. The upper node is coupled to switch 648, controllable by select line A5. Switch 648 is formed in series with a switch 646, controllable by BUS. Before sensing, the SEN node is pre-charged to a sense level (e.g., VSEN). In one embodiment, the SEN node is pre-charged to PWR1 directly device 634, controllable by A2. After pre-charging, the outputs of the user data latches 630-1, 630-2, and 630-3 are coupled to the BUS selectively to control the gate of switch 646 based on the program data.

When the program data does not match the state being sensed, BUS 646 goes high to couple the SEN node to VSS when device 648 is turned on. In this manner, the pre-charged sense level is drained through the third latch scan circuit 644. Because there is no transfer involving SDL at this stage, the SEN node preparation can be done while the bit line is being prepared for sensing. When the program data does match the state being sensed, BUS 646 goes low, isolating the SEN node from the third latch scan circuit 644. Thus, the SEN node will develop a voltage during sensing based on whether the memory cell turns on when the program data matches the selected state. When the program data does not match the selected state, the SEN node drains to ground so that the bit line and SEN node do not develop a voltage based on sensing. Thus, sensing is locked out internally by the sense node when the selected state does not match the target state for a memory cell. This state-dependent lockout, performed prior to sensing, avoids a traditional scan operation following sensing which can harm performance.

Figure 19:
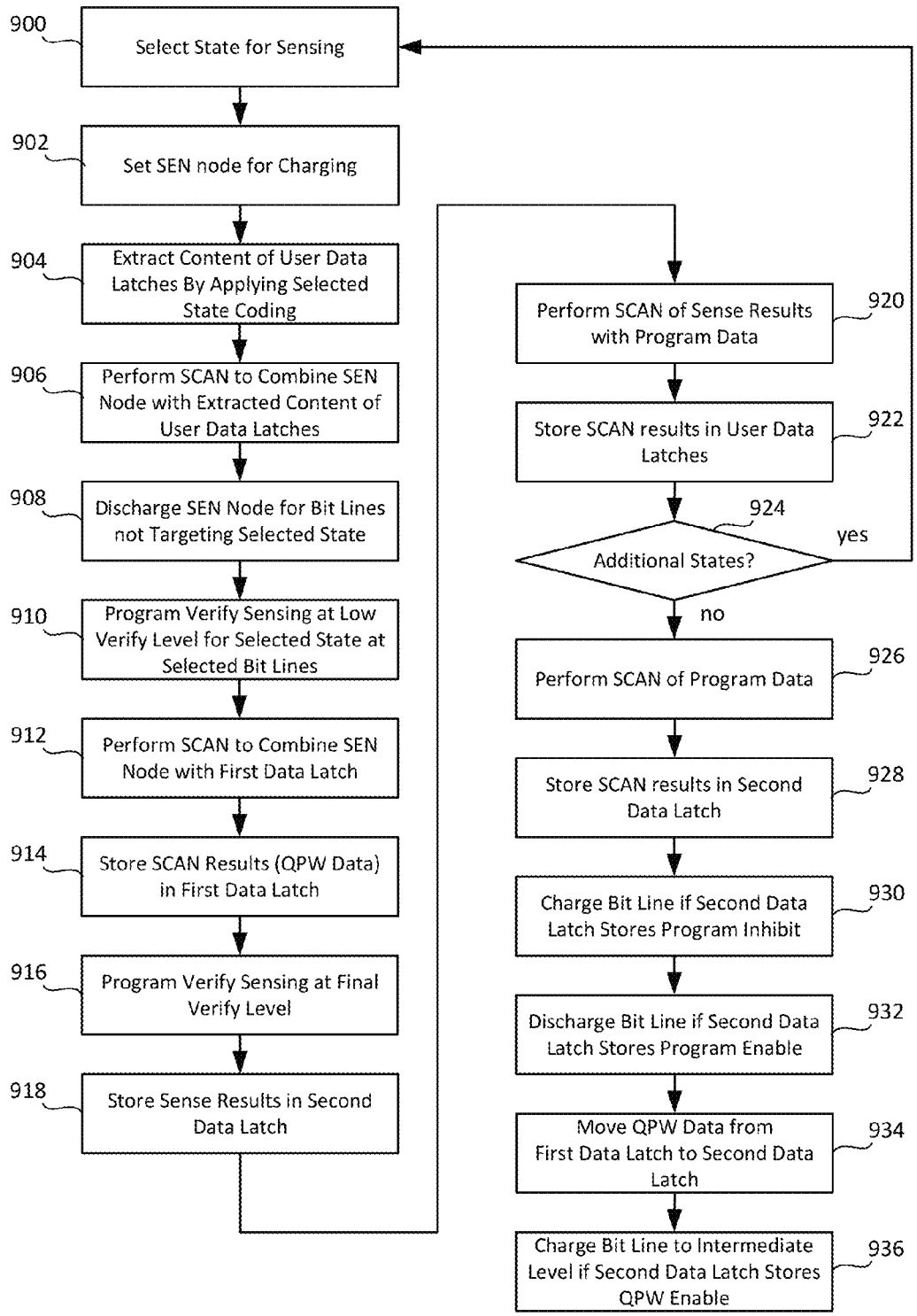
FIG. 19 is a flowchart describing a process of verification using a state dependent lockout prior to sensing according to one embodiment.

FIG. 19 is a flowchart describing a process of program verification including a state dependent lockout in accordance with one embodiment. Similar to FIG. 16, FIG. 19 demonstrates verification for a quick pass write programming technique that sets three different bit line voltages based on a lower level and higher level verification for each state. In FIG. 19, however, lockout sensing is used. In contrast with traditional lockout sensing, a scan operation is incorporated prior to sensing to select a bit line for sensing only when target program data matches the state selected for sensing. Although shown in combination with a quick pass write programming technique, the disclosed process may be used with standard programming based on one verify level for each state.

At step 900, a first state is selected for sensing. At step 902, the SEN node for each sense amplifier in a block or other unit of cells selected for programming is precharged to a sense level. With reference to FIG. 15, for example, the SEN node may be set to VSEN or PWR1 by turning on device 634. At step 904, the content of the user data latches is extracted by applying the selected state coding. For example, when sensing at state A using a coding of '011' shown in FIG. 8, the sense amplifier selects the contents of ADL, BDL, and CDL using the combination of $\overline{ADL}$ to select the data from the ADL latch, BDL to select the data form the BDL data latch, and CDL to select the data from the CDL data latch. In other words, the sense amplifier selects the existing value form BDL and CDL while extracting the opposite value of ADL in accordance with the '011' encoding for state A.

At step 906, the sense amplifier performs a scan operation to combine the level at the SEN node with the extracted contents of the user data latches. For example, latch scan circuit 644 may be used to combine the output of each data latch with the value of the SEN node. Each data latch may have its stored value extracted using the selected state coding and placed on the BUS. Switch 646 may then combine the SEN node value with the BUS value. For example, if state A is the selected state being sensed, latch circuit 644 can be used to combine the SEN node and data latches as shown in Equation 6. For state B, Equation 7 can be used.

$$SEN=SEN*\overline{ADL}*BDL*CDL \quad \text{Equation 6}$$

$$SEN=SEN*\overline{ADL}*\overline{BDL}*CDL \quad \text{Equation 7}$$

At step 908, the sense node for bit lines where the program data matches the selected state are discharged. The SEN node may be drained through switch 648 to ground or VSS when the result of the SCAN operation 906 is negative. If the selected state coding does not match the user data latch program data, the SEN node is drawn to ground. In this manner, sensing is locked out for those bit lines that do not target the selected state for their corresponding memory cell. On the other hand, when the result of the SCAN operation at step 908 is positive, latch circuit 644 isolates the SEN node and sensing proceeds for the corresponding bit line. If the selected state coding matches the user data latch program data, the SEN node remains at the precharge level to begin sensing.

At step 910, sensing is performed at the low verify level for the selected state for the bit lines that are not excluded using the state-dependent lockout. For those bit lines where the program data matches the selected state coding, sensing is performed. The sense node at the sense amplifier will develop a voltage based on whether the memory cell at the bit line turns on under the verify voltage. Step 910 may include applying a low verify voltage to a selected word line and sensing the bit line voltage, or applying a final verify voltage and sensing the bit line voltage after a first time period following the pre-charge of a bit line in various embodiments.

At step 912, a scan operation is performed to combine the results of sensing at the low verify level with the contents of a first data latch. The first data latch (e.g., TDL) in this example is used to store a QPW flag or QPW data to indicate that reduced programming should be used because the memory cell has passed a low verify level for the target state. The content of the first data latch and the SEN node are combined using an OR operation to maintain QPW data for a lower targeted state when sensing is being performed at a higher non-targeted state. When sensing at the lowest state at step 912, the first data latch may be empty such that the combination results in the value of the SEN node only. At step 914, the first data latch is updated based on scanning the results sensing at the SEN node with the existing content of the first data latch.

At step 916, the sense amplifier performs program verify sensing at a final verify level for the selected state. As with the low verify level sensing, final verify level sensing may be performed by applying a final verify voltage for the selected state to the selected word line in one embodiment. In another embodiment, a final verify voltage is used for both high and low verify level sensing but a longer sense period is used for the high level sensing. At step 918, the results of sensing at the final verify level are stored in the a second data latch (e.g., SDL).

At step 920, the results of sensing at the final verify level are combined with the program data in the user data latches using a scan operation. An 'AND' operation of the sense results with the program data in the user data latches can be used. The logic operation is selective for the state being sensed. The sense amplifier applies the coding of the selected state to the user data latch contents to generate a result for those bit lines targeting the selected state. A positive SCAN result (e.g., logic '1') is generated for each user data latch when the program data matches the selected state and the high verify level sensing is positive. The SCAN results are negative (e.g., logic '0') for each bit line targeting another state, and for those bit lines those bit lines targeting the selected state that do not generate positive sensing results. At step 922, the SCAN results are written to the user data latches. The SCAN results will only be written to user data latches matching the selected state. For example, a logic '1' can be written to a user data latch when its contents match that of the selected state and the sense results are positive. A logic '0' can be written when the data latch contents do not match the targeted state, or the sense results are negative. In one embodiment, steps 920 and 922 include writing the erased state coding (e.g., '111' in FIG. 8) to the user data latches when sensing is positive and the user data latches match the selected state. In this manner, programming will be inhibited for the bit line during the next programming iteration.

At step 924, the memory determines whether sensing is to be performed for additional states. If so, the process returns to step 900 to select the next state for sensing. It is noted that the QPW data from the low verify level sensing that is stored in the first data latch does not need to be moved in this embodiment. The second data latch for controlling the bit line voltage is used to strobe the results of sensing at the high verify level but is free at the point of step 926. Thus, the QPW data in the first data latch remains as the bit line is initially setup for program enable or program inhibit.

If sensing has been completed for each state, the sense amplifier scans the user data latch contents for program enable or program inhibit data at step 926. For example, the sense amplifier may determine which user data latches are storing erased state data (e.g., '111') indicating that the corresponding bit line should be inhibited during programming. At step 928, the sense amplifier writes the result of the scan operation to the second data latch. In one example, the sense amplifier writes a first logic state (e.g., logic '0') when the user data latches store erased state data so that the bit line will be inhibited. The sense amplifier writes a second logic state (e.g., logic '1') when the user data latches store any other state coding so that the bit line will be programmed.

After writing the scan result to the second data latch, the bit line is charged at step 930 if the first data latch is in a first logic state (e.g., logic '1'), indicating that the bit line should be inhibited. At step 932, the bit line is discharged if the second data latch is in a second logic state (e.g., logic '0'), indicating that the bit line should be programmed. After using the second data latch to set the bit line level for program or program inhibit, the QPW data is moved from the first data latch to the second data latch at step 934. In this manner, the second data latch stores the QPW data after the user data has been processed and used to set the initial program enable or inhibit value. At step 936, the sense amplifier charges the bit line to an intermediate level from ground if the second data latch stores a first logic value indicating QPW enable. If the second data latch stores a second logic value, the bit line remains at the initial level set at step 930 for program inhibit or step 932 for full programming.

Figure 20:
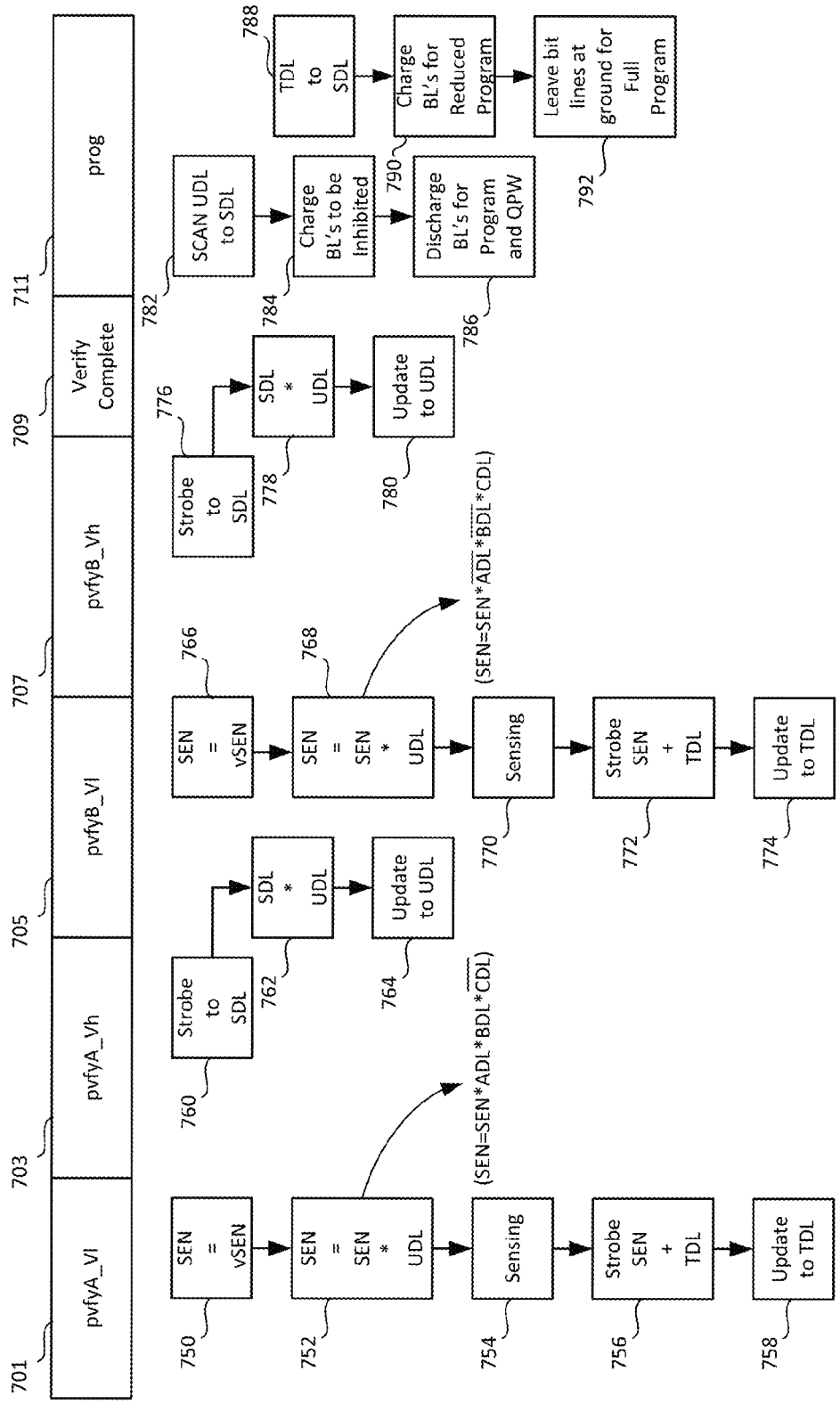
FIG. 20 illustrates a block diagram of a program and verification sequence with a state dependent lockout according to one embodiment.

FIG. 20 is a block diagram describing a specific example of a quick pass write operation using the sense amplifier circuitry of FIG. 15 to perform a state-dependent lockout process. Blocks 701-711 correspond with those blocks from FIG. 17. Block 701 depicts a first sensing operation pvfyA_V1 for program verification at the low verify level V1 for a first programmed state A. Block 703 depicts a second sensing operation pvfyA_Vh for program verification at the high verify level Vh for state A. Block 705 depicts a third sensing operation pvfyB_V1 for program verification at the low verify level V1 for state B. Block 707 depicts a fourth sensing operation pvfyB_Vh for program verification at the high verify level Vh for state B. Although two states are depicted in FIG. 20, additional sensing operations can be performed for each of the programmed states of a memory in a given implementation.

The sense nodes for a group of sense amplifiers corresponding to a set of bit lines being sensed are set up for initial sensing as shown at box 750. All of the bit lines along a selected word line, or the even or odd bit lines along the word line may be set up at 750. The internal sense nodes for each of the sense amplifiers are pre-charged to a sense level. For example, the sense nodes may be charged to PWR1 (or vSEN) by turning on the device 634 shown in FIG. 15.

At box 752, the sense node SEN is combined with the program data from the set of user data latches for the bit line in order to apply a state-dependent lockout. In one example, the output of each data latch for the bit line is connected to BUS (sequentially for example) and combined with the level at the SEN node. The sense amplifier circuitry selects the output of each data latch by applying a state-specific coding to determine those sets of data latches that are storing program data corresponding to the state being sensed. When sensing for state A, the sense amplifier circuitry applies the coding for state A to the output of each user data latch. In this manner, the sense amplifier circuitry outputs a first logic value (e.g., logic '1') when a user data latch matches the state A coding, and outputs a second logic value (e.g., logic '0') when a user data latch does not match the state A coding. The output of each user data latch is then combined with the level at the SEN node using a logic AND operation.

As shown in FIG. 15, the state-selected output from each user data latch is provided to the gate of switch 646. In this manner, the BUS value and SEN node value are combined using a logic AND operation as shown in Equation 3. In this example, BUS is set to go low when the program data matches the selected state so that switch 646 remains off. With switch 646 off, the SEN node is isolated from VSS so that it remains at the pre-charge level vSEN. BUS is set to go high when the program data in a data latch does not match the selected state so that switch 646 turns on. With switch 646 on, the SEN node is coupled to VSS. This discharges the SEN node to ground or VSS for any bit lines having program data that does not match the state A coding. Accordingly, the SEN nodes remain at the pre-charge sense level vSEN for those bit lines targeting the selected state, while the SEN nodes for all other bit lines are discharged. This results in a state-dependent selection of the sense amplifiers for sensing. Only the sense amplifiers for a memory cell to be programmed to the selected state being verified are sensed. The remaining sense amplifiers are locked out from sensing by discharging their internal sense node SEN to ground or VSS.

After applying the state A coding to the user data latch contents for state-dependent selection of the bit lines, sensing is performed at box 754. Sensing may be performed by applying a low verify voltage V1 to the selected word line as shown in the technique of FIG. 14A or by applying a final verify voltage and sensing with a shorter sense period as shown in the technique of FIG. 14B. The SEN node of each sense amplifier is connected to its corresponding bit line while the verify voltage is applied to the selected word line. The SEN nodes for those sense amplifiers that are not locked out will develop a voltage based on the programmed state of the corresponding memory cell. If the memory cell is turned on (not programmed above the verify level), the corresponding NAND string provides a path to ground, draining the bit line and SEN node voltage to ground. The SEN node voltage will decrease, indicating that the memory cell turned on (sensing is negative for the selected state). If the memory cell is not turned on (programmed above the verify level), the corresponding NAND string does not provide a path to ground. Consequently, the SEN node voltage will remain at the pre-charge level, indicating that the memory cell did not turn on (sensing is positive for the selected state).

At box 756, the sense amplifier strobes the combination of the sensing result at pvfyA_V1 and the existing content of the TDL data latch. The TDL data latch is updated at box 758 with the results of strobing at 756. The SEN node value is combined with the existing TDL data latch contents using a SCAN operation that applies a logic OR to the two values. By strobing the combination of TDL and SEN, use of a temporary data latch can be avoided. The sensing result can be updated into TDL directly. In this manner, the existing TDL data latch contents will be maintained if they are updated to logic '1' at any point during sensing for the various states. The sense results at the point of box 756 represent the QPW information for the A-state targeted memory cells. For example, where the sensing result is positive (logic '1'), TDL is updated to logic '1' for those bit lines where data latches ADL, BDL, and CDL store the combination of '011' as determined prior to sensing at box 752. Logic "1" is stored if the cell has passed the low verify level and logic "0" is stored if the cell has not passed the low verify level. The SCAN operation combines the sense results with the existing TDL contents so that any logic '1' results for a targeted state at a bit line are maintained and not overwritten during sensing at the higher level non-targeted states for that bit line.

After strobing the results of pvfyA_V1 and storing in the TDL data latch, sensing at the high verify level for state A begins as shown in box 703. The SEN node is charged and sensing is performed. At box 760, the results of sensing are strobed to the SDL data latch. After strobing the results of pvfyA_Vh, the sense operation at the low verify level for state B begins as shown at box 705. While charging the SEN node, a SCAN operation is performed based on the results of sensing at the high verify level. The contents of the SDL data latch 632 are combined with the contents of the user data latches UDL in a SCAN operation as shown at box 762. This establishes lockout information for the next programming iteration for the targeted A-state memory cells. For example, the sense result in the SDL data latch can be combined with each of the user data latches using an "AND" operation selective for the A-state coding.

The results of the SCAN operation using the high verify level sensing are used to update the user data latches ADL, BDL, and CDL as shown at box 764. The SCAN results from high level sensing represent the lockout information for the A-state targeted memory cells during the next programming iteration. If the bit line has a positive sensing result, the user data latches currently storing A state information (e.g., "011") are flipped during the SCAN operation to indicate the erased state (e.g., 111 in FIG. 8). In this manner, the user data latches for the currently selected state will hold state E information when the memory cell has a positive sensing result. These memory cells will be locked out from programming during the next programming iteration.

After the SEN node has been charged, and the SCAN operation has completed using the contents of TDL at 762 and 764, sensing is performed at the low verify level V1 for state B as shown in box 705. The sense nodes for the group of sense amplifiers corresponding to the set of bit lines are pre-charged to a sense level as shown at box 766. For example, the sense nodes may be charged to PWR1 (or vSEN) by turning on the device 634 shown in FIG. 15.

At box 768, the sense node SEN value is combined with the program data from the user data latches for state-dependent lockout before sensing. The B-state coding is applied to the data latch contents to determine those bit lines whose data latches are storing program data for the B-state. The output of each user data latch is selected based on the B-state coding. Where the B-state coding is '0' for a bit (e.g., in ADL), the opposite value is selected from the data latch (e.g., $\overline{ADL}$) for application in a logic 'AND' with the SEN node value. Where the B-state coding is '1' for a bit (e.g., in CDL), the actual value is selected from the data latch (e.g., CDL), for application in the logic 'AND' with the SEN node value. In this manner, a logic '1' is provided when all three data latches match the selected state coding, and a logic '0' is provided when any of the data latches do not match the selected state coding.

The state-selected output from each user data latch is provided to the gate of switch 646 as shown in Equation 3. BUS goes low when the program data matches the selected state coding so that switch 646 is turned off and the SEN node is isolated from VSS to enable sensing. When BUS goes high due to the program data in a data latch not matching the selected state, switch 646 turns on. With switch 646 on, the SEN node is coupled to VSS to discharge the SEN node. Accordingly, a state-dependent selection of the sense amplifiers that have program data for state B is made for sensing. Only the sense amplifiers for a memory cell to be programmed to the selected state being verified are sensed. The remaining sense amplifiers are locked out from sensing by discharging their internal sense node SEN to ground or VSS.

Sensing is performed at box 770 after applying the state B coding to the user data latch contents. The SEN node of each sense amplifier is connected to its corresponding bit line while the verify voltage is applied to the selected word line. The SEN nodes for those sense amplifiers that are not locked out develop a voltage based on the programmed state of the corresponding memory cell. The sensing result of pvfyB_V1 is strobed and combined with the TDL data latch at box 772. The SEN node value is combined with the existing TDL data latch contents by applying a logic 'OR' to the two values. At the point of box 772, the TDL data latches for bit lines whose program data is state A contain QPW data for state A. The 'OR' operation maintains the existing QPW data for those bit lines targeting the A-state, while updating the QPW data latch based on the SEN value for the bit lines that target the B state. The result of scanning the SEN value with the existing TDL data latch contents is stored in the TDL data latch at box 774.

After strobing the results of pvfyB_V1 and storing in the TDL data latch, sensing at the high verify level for state B begins as shown in box 776. The results of sensing are strobed to the SDL data latch at box 776. After strobing the results of pvfyB_Vh, the verify operation completes at box 709 in order to transition to the next programming iteration. Where additional states are to be sensed, the process shown for state B is repeated until sensing for all states is completed. A SCAN operation is performed based on the results of sensing at the high verify level. The contents of the SDL data latch 632 are combined with the contents of the user data latches UDL in a SCAN operation as shown at box 778. This establishes lockout information for the next programming iteration for the targeted B-state memory cells. For example, the sense result in the SDL data latch can be combined with each of the user data latches using an "AND" operation selective for the B-state coding.

The results of the SCAN operation are used to update the user data latches ADL, BDL, and CDL at box 780. The SCAN results from high level sensing represent the lockout information for the B-state targeted memory cells during the next programming iteration. If the bit line has a positive sensing result, the user data latches currently storing B state information (e.g., "011") are flipped during the SCAN operation to indicate the erased state (e.g., 111 in FIG. 8). In this manner, the user data latches for the currently selected state will hold state E information when the memory cell has a positive sensing result. These memory cells will be locked out from programming during the next programming iteration.

The sense amplifier begins the programming process at box 711. A SCAN operation is performed at step 782 to move the user data to the SDL latch. The contents of the user data latches are scanned to determine if they indicate anything any state other than the erased state (e.g., any latch storing logic '0'). If so, the corresponding SDL data latch is set to logic '0' to set up the corresponding bit line for programming. If the contents of the user data latches indicate the erased state, the corresponding SDL data latch is set of logic '1' for programming inhibit.

The bit lines are initially set up for the next programming iteration as shown at boxes 784 and 786. The bit lines to be inhibited from programming are charged to the program inhibit level (e.g., VDD) at 784. The bit lines that are to be fully programmed or that are to be programmed at the reduced QPW level are discharged to ground at step 786.

The QPW data in the TDL data latch is moved to the SDL data latch 788 to set the designated bit lines for reduced programming. At box 790, the bit lines whose sense amplifiers are storing logic '1' in SDL are charged from ground to the reduced programming level for QPW programming. At box 792, the bit lines whose sense amplifiers are storing logic '0' in SDL remain at 0V for full programming during the next iteration. The operation does not transfer the QPW data to a temporary location as in FIG. 20. Because the SDL data latch is not used to store the QPW data, it doesn't have to be moved prior to scanning the user data latches to the SDL data latch.

Accordingly, the sense amplifier provides a state-dependent lockout that limits sensing to those bit lines that target the currently selected state for sensing. The program data for a bit line is automatically scanned so that an internal sense node of the amplifier discharges when the program data does not match the selected state. In this manner, the bit line is locked out from sensing during the verify process for the selected state. The lockout is performed prior to sensing and is based on the program data to restrict sensing. This may be contrasted with other types of lockouts that lockout sensing for a selected state based on the sense results at a lower verify level for a lower level state. In the presently described embodiment, lockout is based on the program data so that sensing is only performed for a bit line at the target state level. When sensing is performed at other non-targeted states, the sense amplifier automatically discharges the sense node to skip sensing.

A method of program verification in non-volatile storage is thus described, including storing first data in a first data latch based on accumulating sensing results at a set of low verify levels for a plurality of states associated with a plurality of non-volatile storage elements, storing second data in a set of user data latches based on sensing results at a set of final verify levels for the plurality of states, transferring the first data to a temporary node after sensing for the plurality of states, storing third data in the first data latch based on the second data in the set of user data latches after transferring the first data to the temporary node, setting a voltage on a bit line associated with the first data latch based on the third data in the first data latch, transferring the first data to the first data latch after setting the voltage on the bit line, and selectively changing the voltage on the bit line based on the first data in the first data latch.

A non-volatile storage device is described that includes a set of user data latches configured to receive program data for programming to a non-volatile storage element, a first data latch selectively connectable to one or more bit lines in communication with the non-volatile storage element for setting a bit line voltage level during programming, and a dynamic sense node selectively connectable to the one or more bit lines and configured to store a value based on a threshold voltage of the non-volatile storage element during sensing. The set of user data latches are configured to update based on sensing at a plurality of final verify levels corresponding to a plurality of physical states during program verification. The first data latch is configured to update with a quick-pass write (QPW) value based on sensing at a plurality of low verify levels corresponding to the plurality of physical states. The first data latch is configured to set an initial voltage level on the bit line for a program pulse based on the set of user data latches. The dynamic sense node is configured to temporarily store a final QPW value from the first data latch after sensing at the plurality of low verify levels. The first data latch is configured to selectively change the initial voltage level on the bit line for the program pulse based on the final QPW value.

A method of operating non-volatile storage is described that includes storing in a set of user data latches program data for a first non-volatile storage element, programming a first non-volatile storage element using a bit line latch to set a bit line voltage for the first non-volatile storage element during a first program pulse, performing a plurality of sense operations to determine state information for the first non-volatile storage element after the first program pulses, where the sense operations include sensing at a low verify level and a high verify level for each of a plurality of physical states. The method includes updating the set of user data latches based on a scan operation from sensing at the high verify level for each physical state, updating the bit line latch based on a scan operation from sensing at the low verify level for each physical state, transferring data from the bit line latch to a temporary sense node after sensing for the plurality of physical states, updating the bit line latch based on the set of user data latches, setting a first voltage on a bit line for the first non-volatile storage using a bit line latch value based on the set of user data latches, transferring data from the temporary sense node to the bit line latch after setting the first voltage, and setting a second voltage on the bit line on the bit line for the first non-volatile storage element using a bit line latch value based on the scan operation from sensing at the low verify level.

A method of operating non-volatile storage is described that includes storing in a bit line data latch a first value based on scan operations from sensing at a low verify level for a plurality of physical states, storing in a set of user data latches a second value based on scan operations from sensing at a high verify level for the plurality of physical states, transferring the first value to a temporary sense node, scanning the second value to the bit line data latch, setting an initial voltage on the bit line after scanning the second value, scanning the first value to the bit line data latch after setting the initial voltage, and selectively updating the initial voltage after scanning the first value.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the disclosure be defined by the claims appended hereto.

What is claimed is:
1. A non-volatile storage device, comprising:
   a set of user data latches configured to receive program data for programming to a non-volatile storage element, the set of user data latches are configured to update based on sensing at a plurality of final verify levels corresponding to a plurality of physical states during program verification;

a first data latch selectively connectable to one or more bit lines in communication with the non-volatile storage element for setting a bit line voltage level during programming, the first data latch configured to update with a first value based on sensing at a plurality of first verify levels corresponding to the plurality of states and to set an initial voltage level on the one or more bit lines for a program pulse based on the set of user data latches; and a sense node selectively connectable to the one or more bit lines and configured to store a second value based on a threshold voltage of the non-volatile storage element during sensing, the sense node configured to temporarily store the first value from the first data latch after sensing at the plurality of the first verify levels and to selectively change the initial voltage level on the one or more bit lines for the program pulse based on the first value.

2. The non-volatile storage device of claim 1, further comprising:

a bus connected to the first data latch and the sense node, the bus transfers the-first value from the first data latch to the sense node after sensing at the plurality of first verify levels;

wherein the bus transfers a result of scanning an output of the user data latches for program enable or program inhibit to the first data latch after transferring the first value;

wherein the first data latch sets the initial voltage level on the one or more bit lines based on scanning the output of the user data latches.

3. The non-volatile storage device of claim 2, further comprising:

a first scan circuit comprising a first switch and a second switch connected in series, the first switch is connected to the sense node, the second switch includes a gate connected to the bus whereby the first scan circuit generates a value based on a logic combination of the sense node and the bus.

4. The non-volatile storage device of claim 3, further comprising:

a second data latch selectively connectable to the one or more bit lines, the second data latch stores a first result of sensing at each low verify level;

wherein the second data latch includes an output that is scanned with an output of each data latch after sensing at each low verify level to generate the first value.

5. The non-volatile storage device of claim 4, further comprising:

a first scan circuit having a first node connected to the second data latch, a second node connected to a low-level voltage, and a first transistor having a gate connected to the bus.

6. The non-volatile storage device of claim 5, wherein:

the first scan circuit provides a state-specific result as the first value when the set of user data latches matches a state currently being sensed; and the state-specific result is stored in the first data latch.

7. The non-volatile storage device of claim 6, wherein:

the first data latch after first level sensing for a second state includes the state-specific result for a first state; and the state-specific result for the first state is combined with a result of scanning the output of the second data latch and the set of user data latches after low level sensing for the second state.

8. The non-volatile storage device of claim 7, wherein:

the state-specific result for the first state is combined with the result of scanning using a logic OR operation to maintain the state-specific result for the first state when the first state is a targeted state and the second state is a non-targeted state.

9. The non-volatile storage device of claim 1, further comprising:

a three-dimensional array of non-volatile storage elements including the non-volatile storage element.

10. A method of operating non-volatile storage, comprising:

storing in a first data latch a first value based on scan operations from sensing at a low verify level for a plurality of physical states;

storing in a set of user data latches a second value based on scan operations from sensing at a high verify level for the plurality of physical states;

transferring the first value to a temporary node;

updating the first data latch based on the second value;

setting an initial voltage on a bit line after updating the first data latch based on the second value;

updating the first data latch based on the first value after setting the initial voltage; and selectively updating the initial voltage after updating the first data latch based on the first value.

11. A device, comprising:

a first data latch configured to store first data based on accumulated sense results for a first set of verify levels for a plurality of states;

a set of user data latches configured to store second data based on sensing at a second set of verify levels for the plurality of sates;

a node configured to receive the first data from the first data latch after sensing at the first set of verify levels and the second set of verify levels; and a bit line configured to receive an initial voltage based on third data stored in the first data latch after storing the first data at the node and to selectively update the initial voltage based on the first data after transferring the first data from the node to the first data latch.

12. The device of claim 11, wherein:

the first data latch is configured to store the first data from the node after the initial voltage is set for the bit line;

the bit line remains at the initial voltage when the first data stored in the first data latch is a first logic value; and the bit line is charged to a second voltage that is higher than the initial voltage when the first data stored in the first data latch is a second logic value.

13. The device of claim 11, further comprising:

a second data latch configured to store a first result based on sensing at a first verify level of the first set; and a first scan circuit having a node connected to the second data latch, the first scan circuit configured to scan an output of the second data latch with an output of the set of user data latches.

14. The device of claim 13, wherein:

the first scan circuit scans the output of the second data latch by combining the output of the second data latch with an output of each of the user data latches using a logic AND operation with the first scan circuit.

15. The device of claim 14, wherein:
the first scan circuit is configured to combine the output of the second data latch with the output of each of the user data latches for each verify level of the first set to provide the first data when the set of user data latches match a state currently being sensed.

16. The device of claim 15, wherein:
the first scan circuit is configured to combine the first data from a first state with the output of the second data latch in a logic OR operation to maintain the first data from the first state when later sensing at a non-targeted state.

17. The device of claim 16, wherein:
the second data latch is configured to store a second result of sensing at each of the verify levels of the second set; and
the first scan circuit is configured to scan the output of the second data latch with the output of each of the user data latches after storing the second result for each final verify level.

18. The device of claim 17, wherein:
the first scan circuit is configured to scan the output of the second data latch by combining the output of the second data latch with the output of each of the user data latches using a logic AND operation.

19. The device of claim 17, wherein:
the first scan circuit is configured to scan the output of the second data latch to generate the second data, the second data is stored in the set of user data latches; and
the first scan circuit is configured to scan the output of the user data latches to generate the third data after sensing at the second set of verify levels.

20. The device of claim 19, wherein:
the second data for each verify level of the second set is a coding for an erased state when the output of the second data latch indicates a positive result for sensing and the output of each of the user data latches indicates a state currently being sensed.

21. The device of claim 20, wherein:
the second data is a coding for the state currently being sensed when the output of the second data latch indicates a negative result for sensing or the output of each of the user data latches indicates a different state than the state currently being sensed.

22. A device, comprising:
a bit line;
a sense node coupled to the bit line;
a first data latch coupled to the sense node;
a set of user data latches coupled to the sense node; and
a control circuit configured to store first data in the first data latch based on accumulating sense results at a set of low verify levels and second data in the set of user data latches based on sensing results at a set of final verify levels, the control circuit configured to transfer the first data to the sense node after sensing at the set of low verify levels and the set of final verify levels and store third data in the first data latch based on scanning the second data, the control circuit configured to set a voltage on the bit line based on the third data, transfer the first data to the first data latch after setting the voltage, and selectively change the voltage based on the first data.

23. The device of claim 22, further comprising:
a second data latch configured to store a first result based on sensing at a first low verify level;
wherein the control circuit includes a first scan circuit configured to scan an output of the second data latch with an output of the set of user data latches to provide the first data when the set of user data latches matches a state being sensed.

24. The device of claim 23, wherein:
the second data latch is configured to store a second result of sensing at each of the final verify levels after sensing at each of the final verify levels; and
the first scan circuit is configured to scan the output of the second data latch with the output of the set of user data latches after storing the second result for each final verify level.

* * * * *